(12) United States Patent
Chien et al.

(10) Patent No.: US 11,695,042 B2
(45) Date of Patent: Jul. 4, 2023

(54) TRANSISTOR CONTACTS AND METHODS OF FORMING THE SAME

(71) Applicant: Taiwan Semiconductor Manufacturing Co., Ltd., Hsinchu (TW)

(72) Inventors: Wei-Ting Chien, Hsinchu (TW); Wen-Yen Chen, Hsinchu (TW); Li-Ting Wang, Hsinchu (TW); Su-Hao Liu, Jhongpu Township (TW); Liang-Yin Chen, Hsinchu (TW); Huicheng Chang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/344,049

(22) Filed: Jun. 10, 2021

(65) Prior Publication Data

US 2022/0328631 A1 Oct. 13, 2022

Related U.S. Application Data

(60) Provisional application No. 63/172,357, filed on Apr. 8, 2021.

(51) Int. Cl.

| | |
|---|---|
| *H01L 29/10* | (2006.01) |
| *H01L 29/06* | (2006.01) |
| *H01L 29/08* | (2006.01) |
| *H01L 29/66* | (2006.01) |
| *H01L 21/311* | (2006.01) |
| *H01L 21/3115* | (2006.01) |

(Continued)

(52) U.S. Cl.
CPC ...... *H01L 29/1054* (2013.01); *H01L 29/0653* (2013.01); *H01L 29/0847* (2013.01); *H01L 29/66545* (2013.01); *H01L 29/66553* (2013.01)

(58) Field of Classification Search
CPC .......... H01L 21/3115–31155; H01L 21/76897; H01L 29/66515; H01L 21/31116; H01L 21/76825; H01L 29/665; H01J 37/3171
See application file for complete search history.

(56) References Cited

U.S. PATENT DOCUMENTS

| | | | |
|---|---|---|---|
| 6,180,472 | B1 | 1/2001 | Akamatsu et al. |
| 9,105,490 | B2 | 8/2015 | Wang et al. |

(Continued)

FOREIGN PATENT DOCUMENTS

| | | |
|---|---|---|
| TW | 200514148 A | 4/2005 |
| TW | 200536049 A | 11/2005 |

*Primary Examiner* — Sonya McCall-Shepard
(74) *Attorney, Agent, or Firm* — Slater Matsil, LLP

(57) ABSTRACT

In an embodiment, a device includes: a gate structure on a channel region of a substrate; a gate mask on the gate structure, the gate mask including a first dielectric material and an impurity, a concentration of the impurity in the gate mask decreasing in a direction extending from an upper region of the gate mask to a lower region of the gate mask; a gate spacer on sidewalls of the gate mask and the gate structure, the gate spacer including the first dielectric material and the impurity, a concentration of the impurity in the gate spacer decreasing in a direction extending from an upper region of the gate spacer to a lower region of the gate spacer; and a source/drain region adjoining the gate spacer and the channel region.

20 Claims, 41 Drawing Sheets

(51) Int. Cl.
    *H01L 21/768* (2006.01)
    *H01L 29/165* (2006.01)
    *H01L 29/78* (2006.01)
    *H01L 29/417* (2006.01)
    *H01L 29/423* (2006.01)
    *H01L 21/8234* (2006.01)
    *H01L 27/088* (2006.01)

(56) References Cited

U.S. PATENT DOCUMENTS

| | | |
|---|---|---|
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2004/0245583 A1 | 12/2004 | Horiuchi et al. |
| 2005/0239282 A1 | 10/2005 | Chen et al. |
| 2009/0317964 A1* | 12/2009 | Suuronen ............ H01L 21/6875 165/104.19 |
| 2015/0155172 A1 | 6/2015 | Breil |
| 2016/0276465 A1 | 9/2016 | Hung et al. |
| 2016/0351566 A1 | 12/2016 | Niimi et al. |
| 2017/0178968 A1 | 6/2017 | Zhou |
| 2019/0259616 A1 | 8/2019 | Ebrish et al. |
| 2019/0371664 A1 | 12/2019 | Wu et al. |

* cited by examiner

TRANSISTOR CONTACTS AND METHODS OF FORMING THE SAME

PRIORITY CLAIM AND CROSS-REFERENCE

This application claims the benefit of U.S. Provisional Application No. 63/172,357, filed on Apr. 8, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
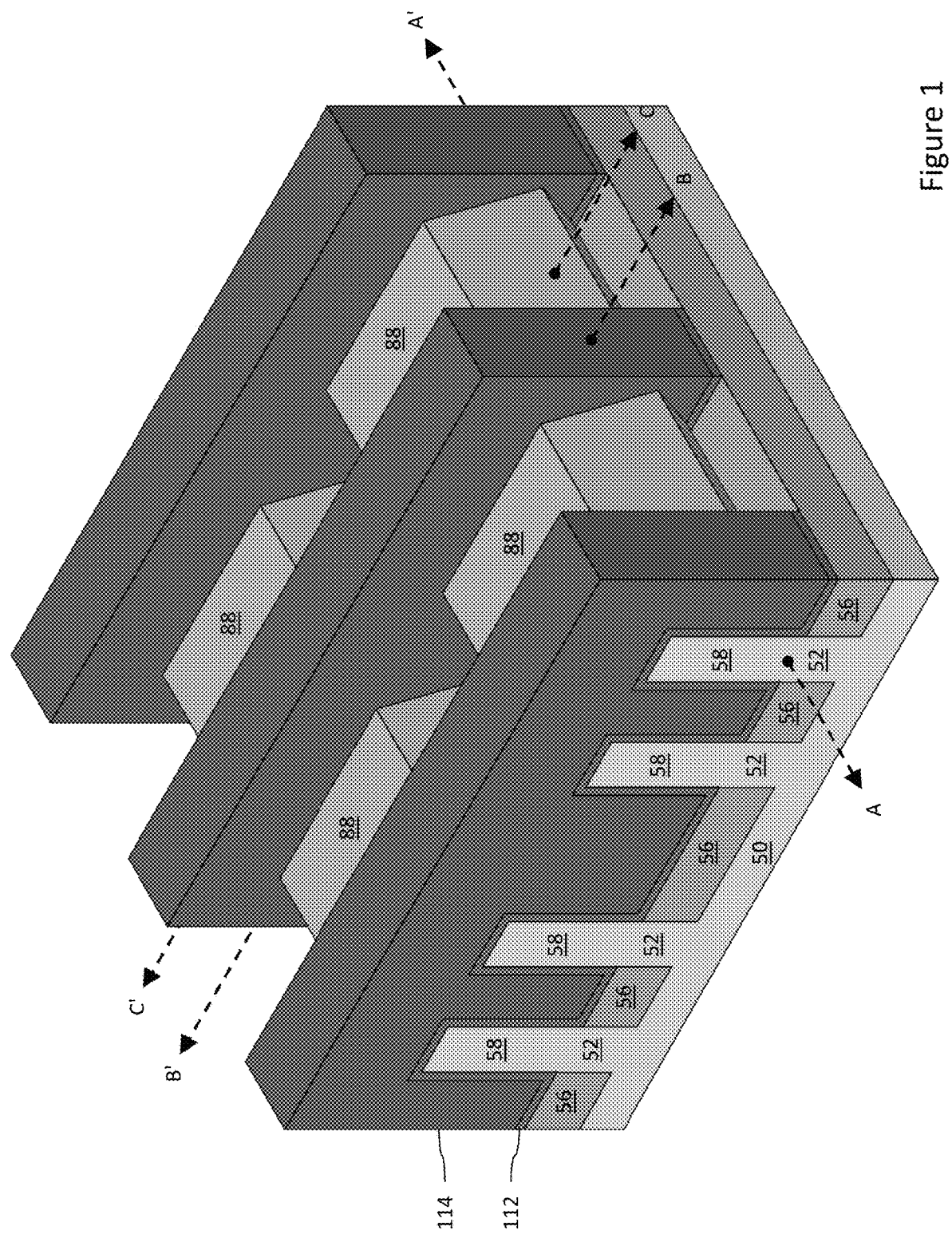
FIG. 1 illustrates an example of a fin field-effect transistor (FinFET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, an implantation process is performed to modify upper regions of gate masks and an inter-layer dielectric. Contact openings for source/drain contacts are then formed through the inter-layer dielectric in a self-aligned contact (SAC) etching process. The modified upper regions of the gate masks have a high etching selectivity from the etching of the inter-layer dielectric so that losses of the gate masks are reduced during the etching process. Decreasing such losses can reduce leakage in the devices, thereby increasing device performance.

FIG. 1 illustrates an example of Fin Field-Effect Transistors (FinFETs), in accordance with some embodiments. FIG. 1 is a three-dimensional view, where some features of the FinFETs are omitted for illustration clarity. The FinFETs include fins 52 extending from a substrate 50 (e.g., a semiconductor substrate), with the fins 52 acting as channel regions 58 for the FinFETs. Isolation regions 56, such as shallow trench isolation (STI) regions, are disposed between adjacent fins 52, which may protrude above and from between adjacent isolation regions 56. Although the isolation regions 56 are described/illustrated as being separate from the substrate 50, as used herein, the term "substrate" may refer to the semiconductor substrate alone or a combination of the semiconductor substrate and the isolation regions. Additionally, although the bottom portions of the fins 52 are illustrated as being single, continuous materials with the substrate 50, the bottom portions of the fins 52 and/or the substrate 50 may include a single material or a plurality of materials. In this context, the fins 52 refer to the portion extending from between the adjacent isolation regions 56.

Gate dielectrics 112 are along sidewalls and over top surfaces of the fins 52. Gate electrodes 114 are over the gate dielectrics 112. Epitaxial source/drain regions 88 are disposed in opposite sides of the fin 52 with respect to the gate dielectrics 112 and gate electrodes 114. The epitaxial source/drain regions 88 may be shared between various fins 52. For example, adjacent epitaxial source/drain regions 88 may be electrically connected, such as through coalescing the epitaxial source/drain regions 88 by epitaxial growth, or through coupling the epitaxial source/drain regions 88 with a same source/drain contact.

FIG. 1 further illustrates reference cross-sections that are used in later figures. Cross-section A-A' is along a longitudinal axis of a fin 52 and in a direction of, for example, a current flow between the epitaxial source/drain regions 88 of a FinFET. Cross-section B-B' is perpendicular to cross-section A-A' and is along a longitudinal axis of a gate electrode 114. Cross-section C-C' is parallel to cross-section B-B' and extends through epitaxial source/drain regions 88 of the FinFETs. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

Figure 2:
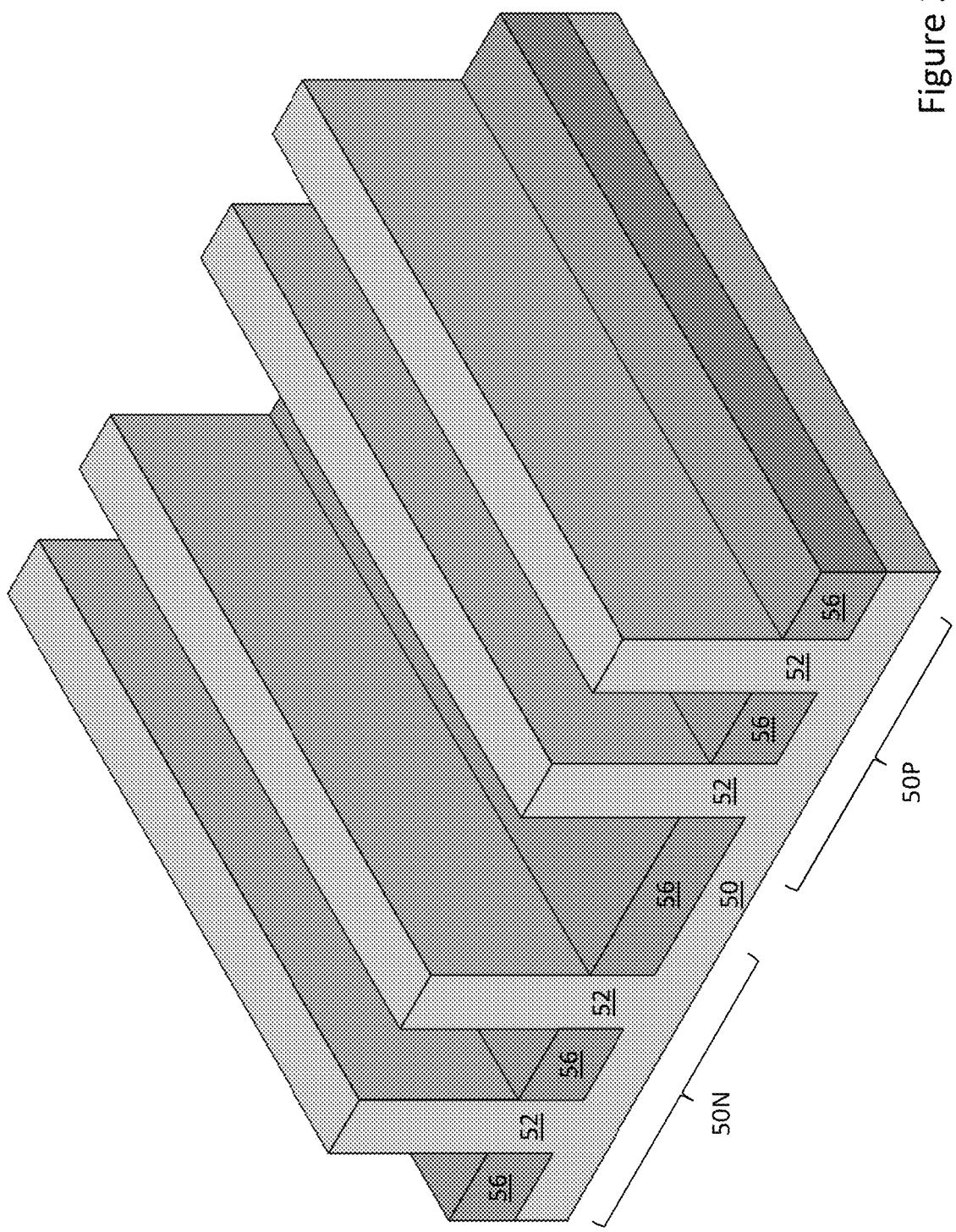
FIGS. 2-20C are views of intermediate stages in the manufacturing of FinFETs, in accordance with some embodiments.
Figure 3:
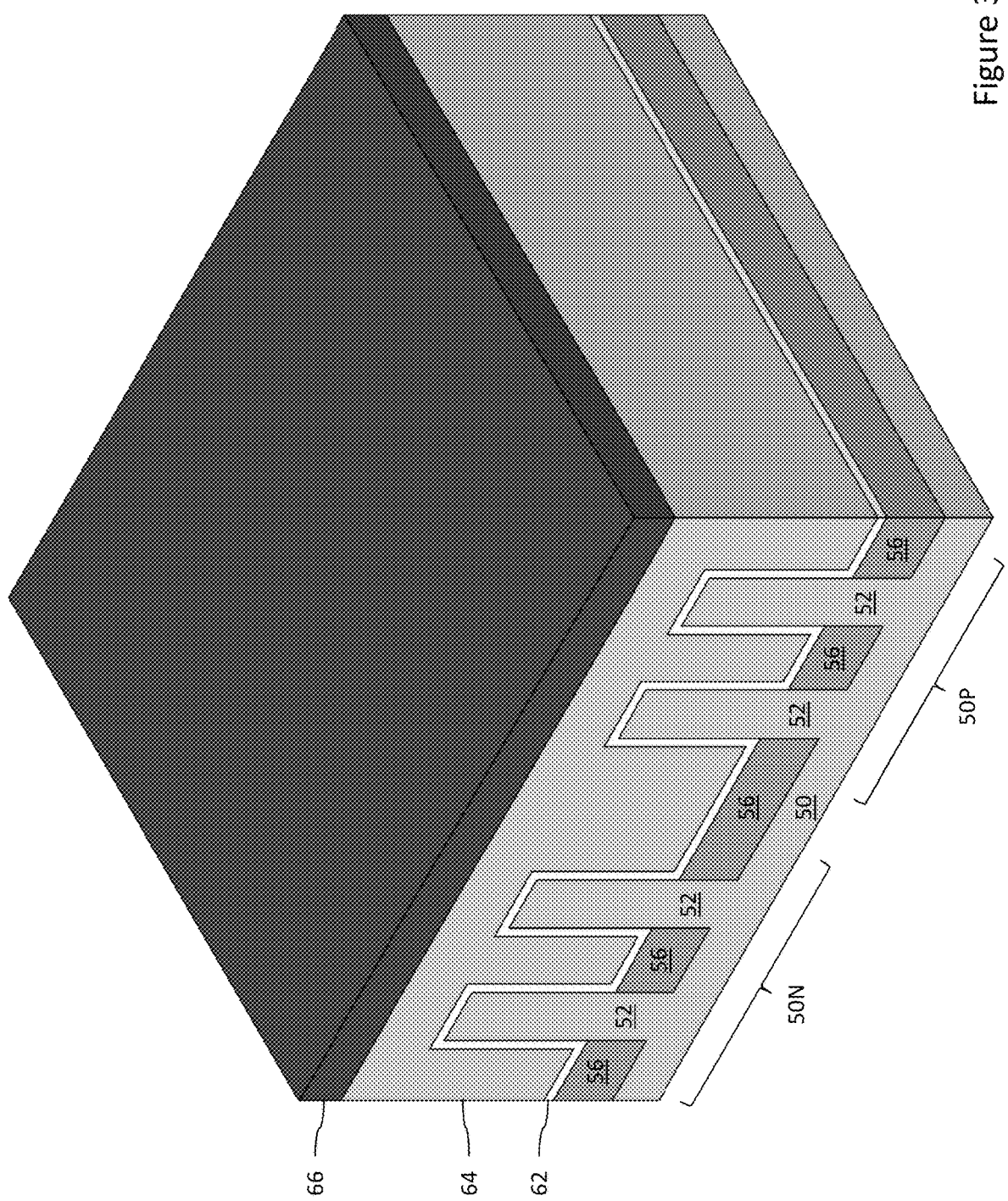
Figure 4:
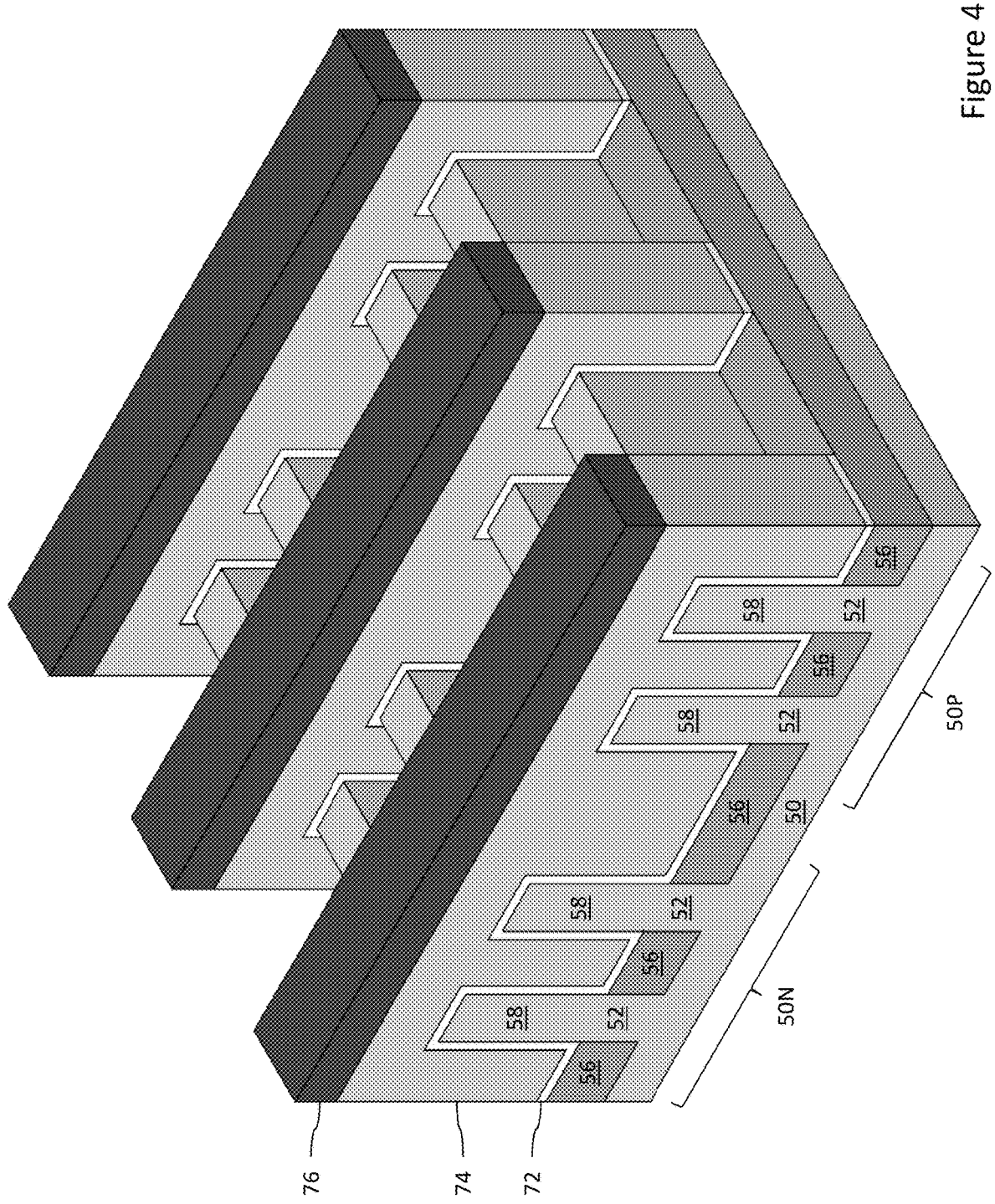

FIGS. 2-20C are views of intermediate stages in the manufacturing of FinFETs, in accordance with some embodiments. FIGS. 2, 3, and 4, are three-dimensional views showing a similar three-dimensional view as FIG. 1. FIGS. 5A, 6A, 7A, 8A, 9A, 10A, 11A, 12A, 13A, 14A, 15A, 16A, 17A, 18A, 19A, and 20A are cross-sectional views illustrated along a similar cross-section as reference cross-section A-A' in FIG. 1. FIGS. 5B, 6B, 7B, 8B, 9B, 10B, 11B, 12B, 13B, 14B, 15B, 16B, 17B, 18B, 19B, and 20B are cross-sectional views illustrated along a similar cross-section as reference cross-section B-B' in FIG. 1. FIGS. 5C, 6C, 7C, 8C, 9C, 10C, 11C, 12C, 13C, 14C, 15C, 16C, 17C, 18C, 19C, and 20C are cross-sectional views illustrated along a similar cross-section as reference cross-section C-C' in FIG. 1.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 50 has an n-type region 50N and a p-type region 50P. The n-type region 50N can be for forming n-type devices, such as NMOS transistors, e.g., n-type FinFETs, and the p-type region 50P can be for forming p-type devices, such as PMOS transistors, e.g., p-type FinFETs. The n-type region 50N may be physically separated (not separately illustrated) from the p-type region 50P, and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Fins 52 are formed in the substrate 50. The fins 52 are semiconductor strips. The fins 52 may be formed in the substrate 50 by etching trenches in the substrate 50. The etching may be any acceptable etching process, such as a reactive ion etch (RIE), neutral beam etch (NBE), the like, or a combination thereof. The etching process may be anisotropic.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks to pattern the fins 52. In some embodiments, the mask (or other layer) may remain on the fins 52.

STI regions 56 are formed over the substrate 50 and between adjacent fins 52. The STI regions 56 are disposed around lower portions of the fins 52 such that upper portions of the fins 52 protrude from between adjacent STI regions 56. In other words, the upper portions of the fins 52 extend above the top surfaces of the STI regions 56. The STI regions 56 separate the features of adjacent devices.

The STI regions 56 may be formed by any suitable method. For example, an insulation material can be formed over the substrate 50 and between adjacent fins 52. The insulation material may be an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof. Other insulation materials formed by any acceptable process may be used. In some embodiments, the insulation material is silicon oxide formed by FCVD. An anneal process may be performed once the insulation material is formed. Although the STI regions 56 are each illustrated as a single layer, some embodiments may utilize multiple layers. For example, in some embodiments a liner (not separately illustrated) may first be formed along surfaces of the substrate 50 and the fins 52. Thereafter, an insulation material, such as those previously described may be formed over the liner. In an embodiment, the insulation material is formed such that excess insulation material covers the fins 52. A removal process is then applied to the insulation material to remove excess insulation material over the fins 52. In some embodiments, a planarization process such as a chemical mechanical polish (CMP), an etch-back process, combinations thereof, or the like may be utilized. In embodiments in which a mask remains on the fins 52, the planarization process may expose the mask or remove the mask. After the planarization process, the top surfaces of the insulation material and the mask (if present) or the fins 52 are coplanar (within process variations). Accordingly, the top surfaces of the mask (if present) or the fins 52 are exposed through the insulation material. In the illustrated embodiment, no mask remains on the fins 52. The insulation material is then recessed to form the STI regions 56. The insulation material is recessed such that upper portions of the fins 52 protrude from between adjacent portions of the insulation material. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The insulation material may be recessed using any acceptable etching process, such as one that is selective to the material of the insulation material (e.g., selectively etches the insulation material of the STI regions 56 at a faster rate than the material of the fins 52). For example, an oxide removal may be performed using dilute hydrofluoric (dHF) acid.

The process previously described is just one example of how the fins 52 and the STI regions 56 may be formed. In some embodiments, the fins 52 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 52. In some embodiments where epitaxial structures are epitaxially grown, the epitaxially grown materials may be in situ doped during growth, which may obviate prior and/or subsequent implantations, although in situ and implantation doping may be used together.

Further, it may be advantageous to epitaxially grow a material in n-type region 50N different from the material in p-type region 50P. In various embodiments, upper portions of the fins 52 may be formed of silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further, appropriate wells (not separately illustrated) may be formed in the fins 52 and/or the substrate 50. The wells may have a conductivity type opposite from a conductivity type of source/drain regions that will be subsequently formed in each of the n-type region 50N and the p-type region 50P. In some embodiments, a p-type well is formed in the n-type region 50N, and an n-type well is formed in the p-type region 50P. In some embodiments, a p-type well or an n-type well is formed in both the n-type region 50N and the p-type region 50P.

In embodiments with different well types, different implant steps for the n-type region 50N and the p-type region 50P may be achieved using a mask (not separately illustrated) such as a photoresist. For example, a photoresist may be formed over the fins 52 and the STI regions 56 in the n-type region 50N. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of $10^{13}$ cm$^{-3}$ to $10^{14}$ cm$^{-3}$. After the implant, the photoresist is removed, such as by any acceptable ashing process.

Following or prior to the implanting of the p-type region 50P, a mask (not separately illustrated) such as a photoresist is formed over the fins 52 and the STI regions 56 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of $10^{13}$ cm$^{-3}$ to $10^{14}$ cm$^{-3}$. After the implant, the photoresist is removed, such as by any acceptable ashing process.

After the implants of the n-type region 50N and the p-type region 50P, an anneal may be performed to repair implant damage and to activate the p-type and/or n-type impurities that were implanted. In some embodiments where epitaxial structures are epitaxially grown for the fins 52, the grown materials may be in situ doped during growth, which may obviate the implantations, although in situ and implantation doping may be used together.

In FIG. 3, a dummy dielectric layer 62 is formed on the fins 52. The dummy dielectric layer 62 may be formed of a dielectric material such as silicon oxide, silicon nitride, a combination thereof, or the like, which may be deposited or thermally grown according to acceptable techniques. A dummy gate layer 64 is formed over the dummy dielectric layer 62, and a mask layer 66 is formed over the dummy gate layer 64. The dummy gate layer 64 may be deposited over the dummy dielectric layer 62 and then planarized, such as by a CMP. The mask layer 66 may be deposited over the dummy gate layer 64. The dummy gate layer 64 may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer 64 may be formed of material(s) that have a high etching selectivity from the etching of insulation materials, e.g., the STI regions 56 and/or the dummy dielectric layer 62. The mask layer 66 may be formed of a dielectric material such as silicon nitride, silicon oxynitride, or the like. In this example, a single dummy gate layer 64 and a single mask layer 66 are formed across the n-type region 50N and the p-type region 50P. In the illustrated embodiment, the dummy dielectric layer 62 covers the fins 52 and the STI regions 56, such that the dummy dielectric layer 62 extends over the STI regions 56 and between the dummy gate layer 64 and the STI regions 56. In another embodiment, the dummy dielectric layer 62 covers only the fins 52.

In FIG. 4, the mask layer 66 is patterned using acceptable photolithography and etching techniques to form masks 76. The pattern of the masks 76 is then transferred to the dummy gate layer 64 by any acceptable etching technique to form dummy gates 74. The pattern of the masks 76 may optionally be further transferred to the dummy dielectric layer 62 by any acceptable etching technique to form dummy dielectrics 72. The dummy gates 74 cover respective channel regions 58 of the fins 52. The pattern of the masks 76 may be used to physically separate adjacent dummy gates 74. The dummy gates 74 may also have lengthwise directions substantially perpendicular (within process variations) to the lengthwise directions of the fins 52. The masks 76 may be removed during the patterning of the dummy gate 74, or may be removed during subsequent processing.

FIGS. 5A-20C illustrate various additional steps in the manufacturing of embodiment devices. FIGS. 5A-20C illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are described in the text accompanying each figure.

Figure 5A:
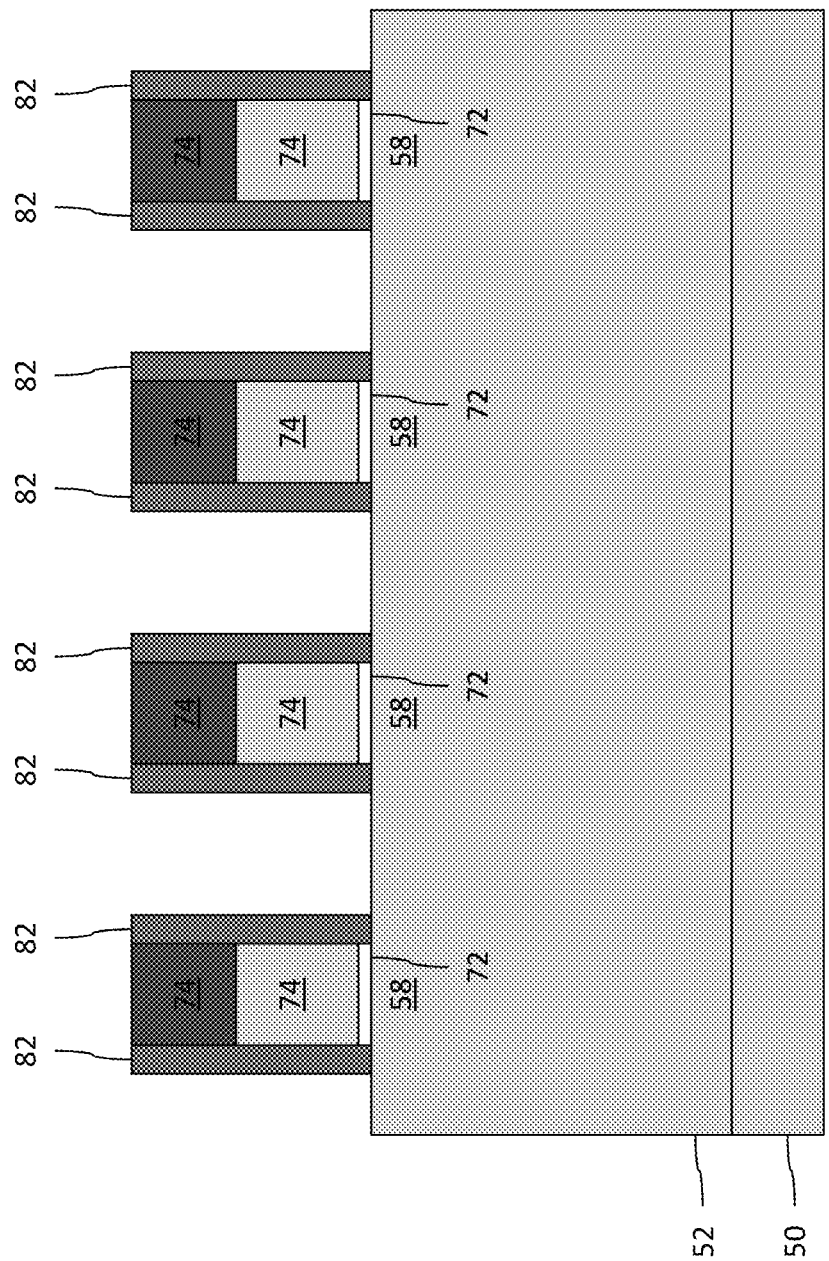
Figure 5C:
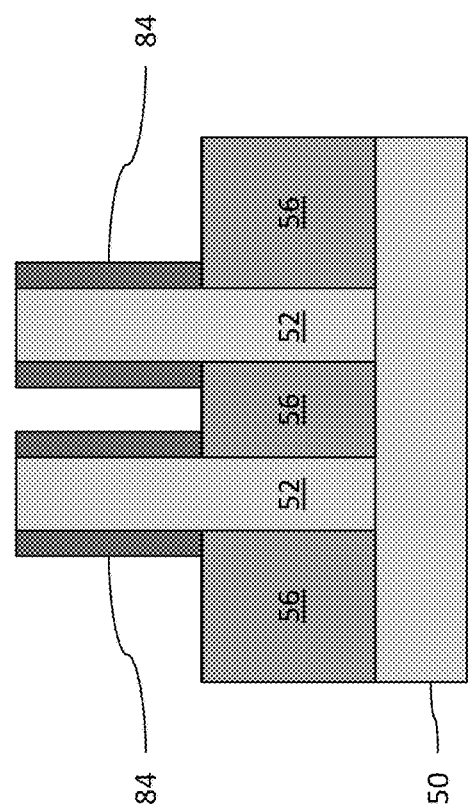
Figure 5B:
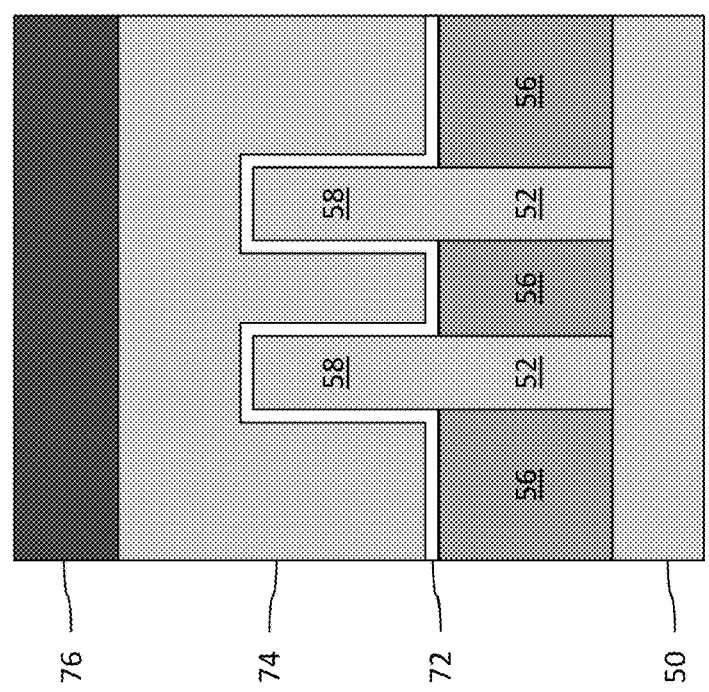

In FIGS. 5A-5C, gate spacers 82 are formed over the fins 52, on exposed sidewalls of the masks 76 (if present), the dummy gates 74, and the dummy dielectrics 72. The gate spacers 82 may be formed by conformally depositing one or more dielectric material(s) and subsequently etching the dielectric material(s). Acceptable dielectric materials may include silicon nitride, silicon carbonitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 74 (thus forming the gate spacers 82, see FIG. 5A). As will be subsequently described in greater detail, in some embodiments the etch used to form the gate spacers 82 is adjusted so that the dielectric material(s), when etched, also have portions left on the sidewalls of the fins 52 (thus forming fin spacers 84, see FIG. 5C). After etching, the fin spacers 84 (if present) and the gate spacers 82 can have straight sidewalls (as illustrated) or can have rounded sidewalls (not separately illustrated).

Further, implants may be performed to form lightly doped source/drain (LDD) regions (not separately illustrated). In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the fins 52 exposed in the p-type region 50P. The mask may then be removed. Subsequently, a mask (not separately illustrated) such as a photoresist may be formed over the p-type region 50P while exposing the n-type region 50N, and appropriate type impurities (e.g., n-type) may be implanted into the fins 52 exposed in the n-type region 50N. The mask may then be removed. The n-type impurities may be any of the n-type impurities previously described, and the p-type impurities may be any of the p-type impurities previously described. During the implanting, the channel regions 58 remain covered by the dummy gates 74, so that the channel regions 58 remain substantially free of the impurity implanted to form the LDD regions. The LDD regions may have a concentration of impurities in the range of $10^{15}$ cm$^{-3}$ to $10^{19}$ cm$^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Figure 6A:
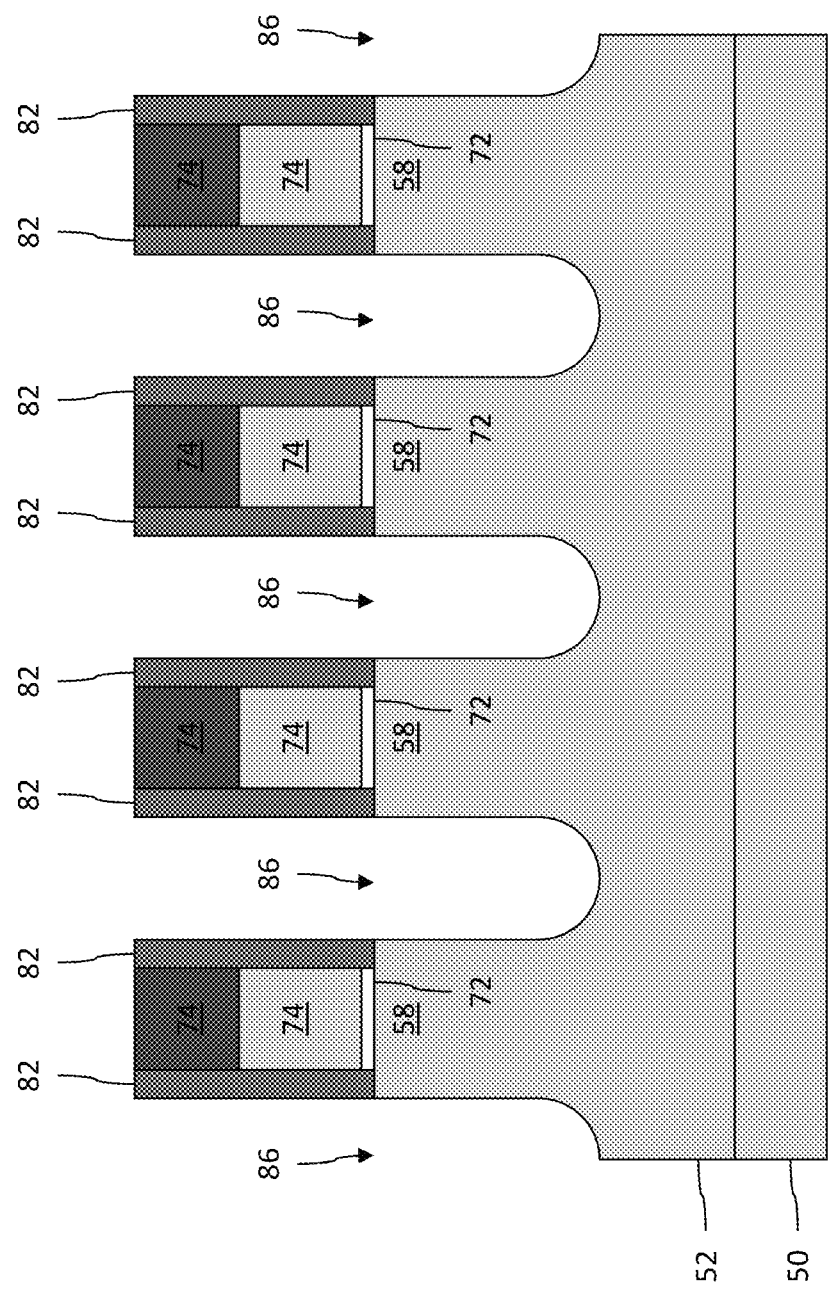
Figure 6C:
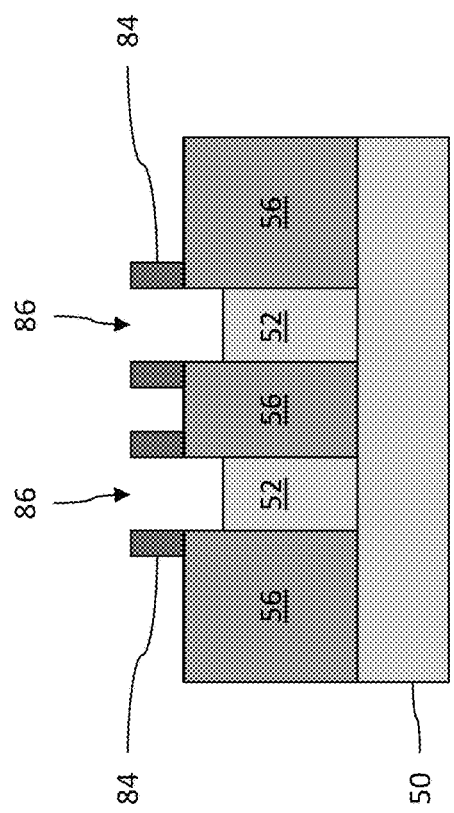
Figure 6B:
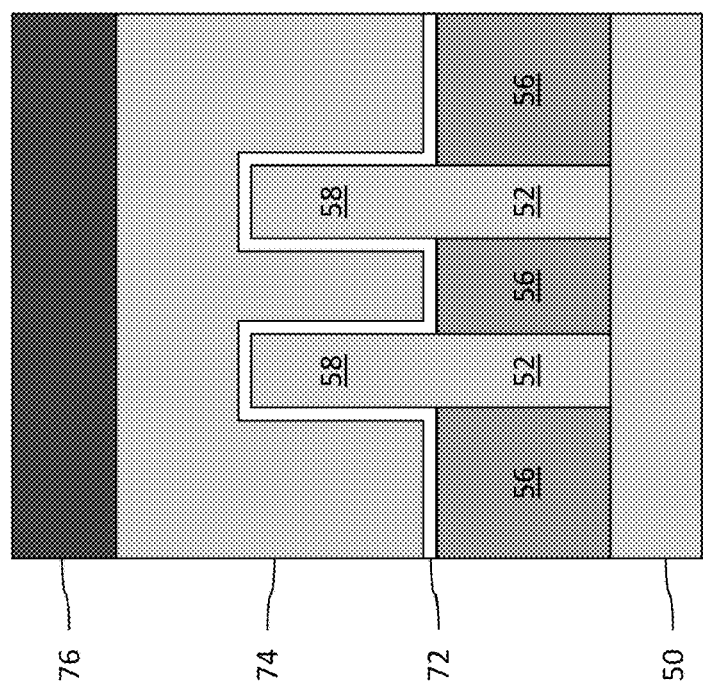

In FIGS. 6A-6C, source/drain recesses 86 are formed in the fins 52. In the illustrated embodiment, the source/drain recesses 86 extend into the fins 52. The source/drain recesses 86 may also extend into the substrate 50. In various embodiments, the source/drain recesses 86 may extend to a top surface of the substrate 50 without etching the substrate 50; the fins 52 may be etched such that bottom surfaces of the source/drain recesses 86 are disposed below the top surfaces of the STI regions 56; or the like. The source/drain recesses 86 may be formed by etching the fins 52 using an anisotropic etching processes, such as a RIE, a NBE, or the like. The gate spacers 82 and the dummy gates 74 collectively mask portions of the fins 52 during the etching processes used to form the source/drain recesses 86. Timed etch processes may be used to stop the etching of the source/drain recesses 86 after the source/drain recesses 86 reach a desired depth. In some embodiments, the fin spacers 84 are also recessed until they are a desired height. Controlling the height of the fin spacers 84 allows the dimensions of the subsequently grown source/drain regions to be controlled.

Figure 7A:
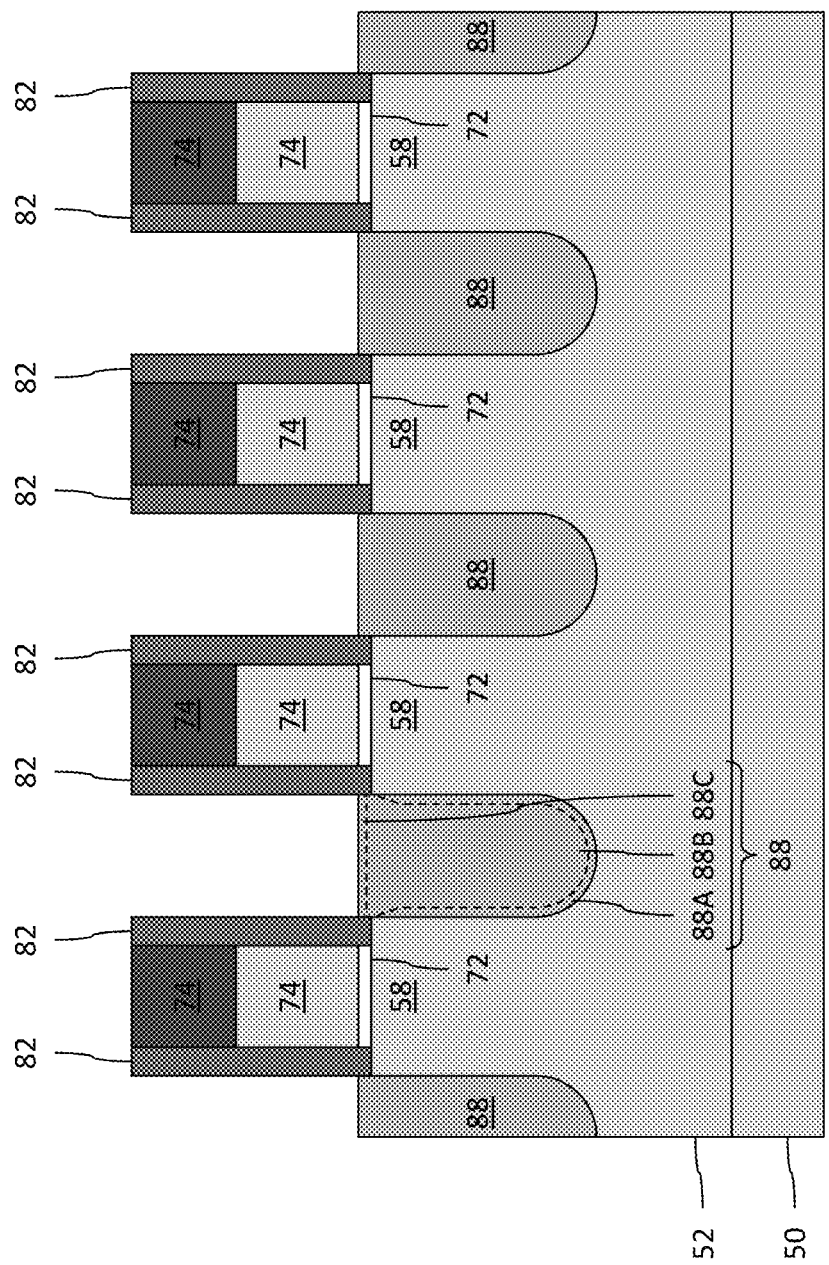
Figure 7C:
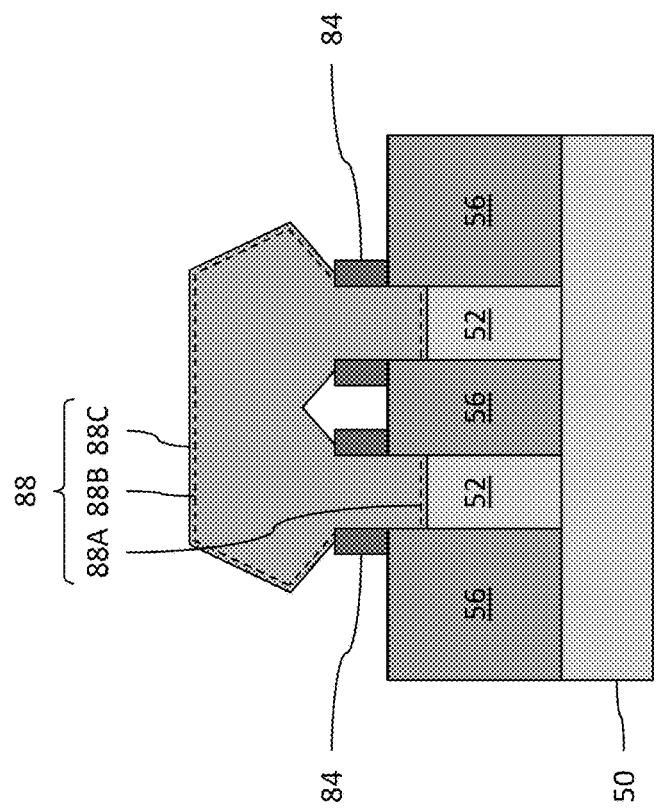
Figure 7B:
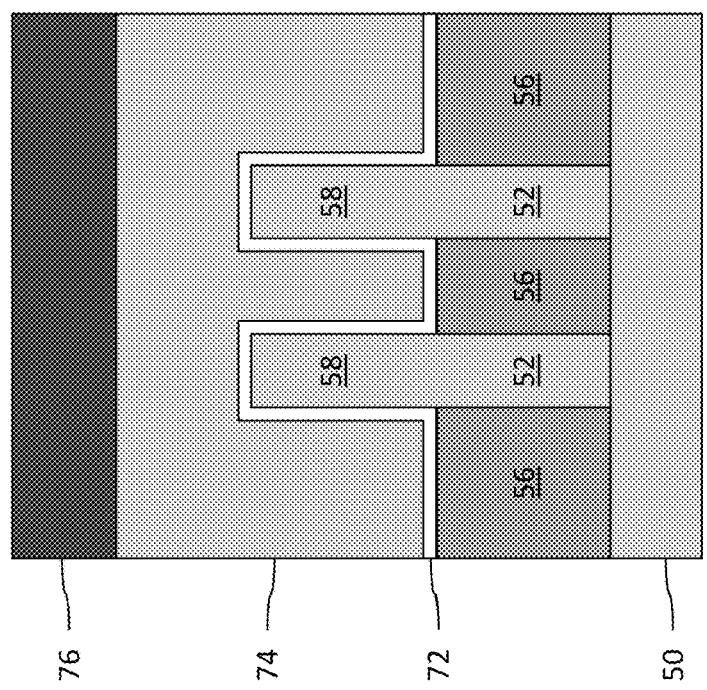

In FIGS. 7A-7C, epitaxial source/drain regions 88 are formed in the source/drain recesses 86. The epitaxial source/drain regions 88 are thus disposed in the fins 52 such that each dummy gate 74 (and corresponding channel region 58) is between respective adjacent pairs of the epitaxial source/drain regions 88. The epitaxial source/drain regions 88 thus adjoin the channel regions 58 and the gate spacers 82. In some embodiments, the gate spacers 82 are used to separate the epitaxial source/drain regions 88 from the dummy gates 74 by an appropriate lateral distance so that the epitaxial source/drain regions 88 do not short out with subsequently formed gates of the resulting FinFETs. A material of the epitaxial source/drain regions 88 may be selected to exert stress in the respective channel regions 58, thereby improving performance.

The epitaxial source/drain regions 88 in the n-type region 50N may be formed by masking the p-type region 50P. Then, the epitaxial source/drain regions 88 in the n-type region 50N are epitaxially grown in the source/drain recesses 86 in the n-type region 50N. The epitaxial source/drain regions 88 may include any acceptable material appropriate for n-type devices. For example, if the fins 52 are silicon, the epitaxial source/drain regions 88 in the n-type region 50N may include materials exerting a tensile strain on the channel regions 58, such as silicon, silicon carbide, phosphorous doped silicon carbide, silicon phosphide, or the like. The epitaxial source/drain regions 88 in the n-type region 50N may be referred to as "n-type source/drain regions." The epitaxial source/drain regions 88 in the n-type region 50N may have surfaces raised from respective surfaces of the fins 52 and may have facets.

The epitaxial source/drain regions 88 in the p-type region 50P may be formed by masking the n-type region 50N. Then, the epitaxial source/drain regions 88 in the p-type region 50P are epitaxially grown in the source/drain recesses 86 in the p-type region 50P. The epitaxial source/drain regions 88 may include any acceptable material appropriate for p-type devices. For example, if the fins 52 are silicon, the epitaxial source/drain regions 88 in the p-type region 50P may include materials exerting a compressive strain on the channel regions 58, such as silicon germanium, boron doped silicon germanium, germanium, germanium tin, or the like. The epitaxial source/drain regions 88 in the p-type region 50P may be referred to as "p-type source/drain regions." The epitaxial source/drain regions 88 in the p-type region 50P may have surfaces raised from respective surfaces of the fins 52 and may have facets.

The epitaxial source/drain regions 88 and/or the fins 52 may be implanted with impurities to form source/drain regions, similar to the process previously described for forming LDD regions, followed by an anneal. The source/drain regions may have an impurity concentration in the range of $10^{19}$ cm$^{-3}$ to $10^{21}$ cm$^{-3}$. The n-type and/or p-type impurities for source/drain regions may be any of the impurities previously described. In some embodiments, the epitaxial source/drain regions 88 may be in situ doped during growth.

As a result of the epitaxy processes used to form the epitaxial source/drain regions 88, upper surfaces of the epitaxial source/drain regions have facets which expand laterally outward beyond sidewalls of the fins 52. In some embodiments, these facets cause adjacent epitaxial source/drain regions 88 to merge as illustrated by FIG. 7C. In some embodiments, adjacent epitaxial source/drain regions 88 remain separated after the epitaxy process is completed. In the illustrated embodiments, the fin spacers 84 are formed to cover a portion of the sidewalls of the fins 52 that extend above the STI regions 56, thereby blocking the epitaxial growth. In another embodiment, the spacer etch used to form the gate spacers 82 is adjusted to not form the fin spacers 84, so as to allow the epitaxial source/drain regions 88 to extend to the surface of the STI regions 56.

The epitaxial source/drain regions 88 may include one or more semiconductor material layers. For example, the epitaxial source/drain regions 88 may each include a liner layer 88A, a main layer 88B, and a finishing layer 88C (or more generally, a first semiconductor material layer, a second semiconductor material layer, and a third semiconductor material layer). Any number of semiconductor material layers may be used for the epitaxial source/drain regions 88. The liner layers 88A, the main layers 88B, and the finishing layers 88C may be formed of different semiconductor materials and/or may be doped to different impurity concentrations. In some embodiments, the main layers 88B have a greater concentration of impurities than the finishing layers 88C, and the finishing layers 88C have a greater concentration of impurities than the liner layers 88A. In embodiments in which the epitaxial source/drain regions 88 include three semiconductor material layers, the liner layers 88A may be grown in the source/drain recesses 86, the main layers 88B may be grown on the liner layers 88A, and the finishing layers 88C may be grown on the main layers 88B. Forming the liner layers 88A with a lesser concentration of impurities than the main layers 88B may increase adhesion in the source/drain recesses 86, and forming the finishing layers 88C with a lesser concentration of impurities than the main layers 88B may reduce out-diffusion of dopants from the main layers 88B during subsequent processing.

Figure 8A:
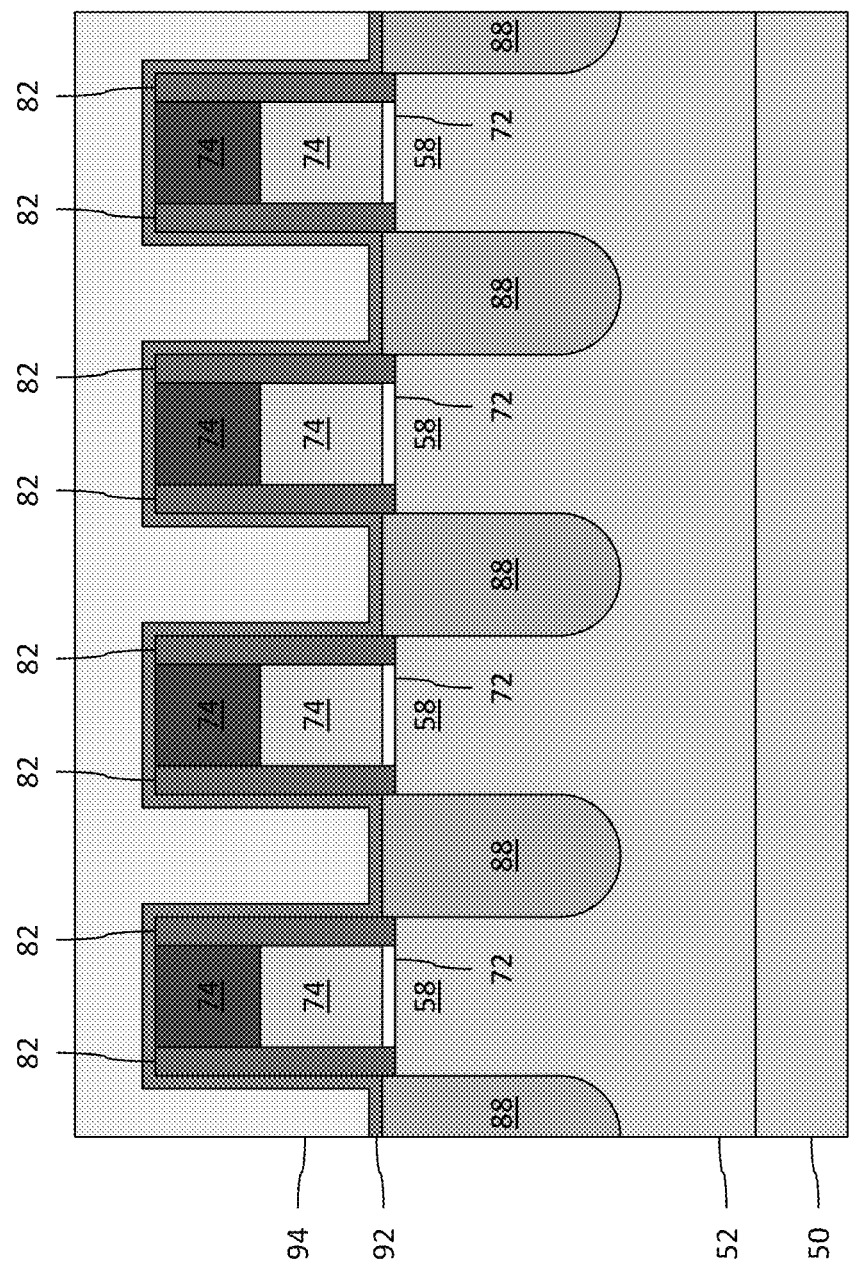
Figure 8C:
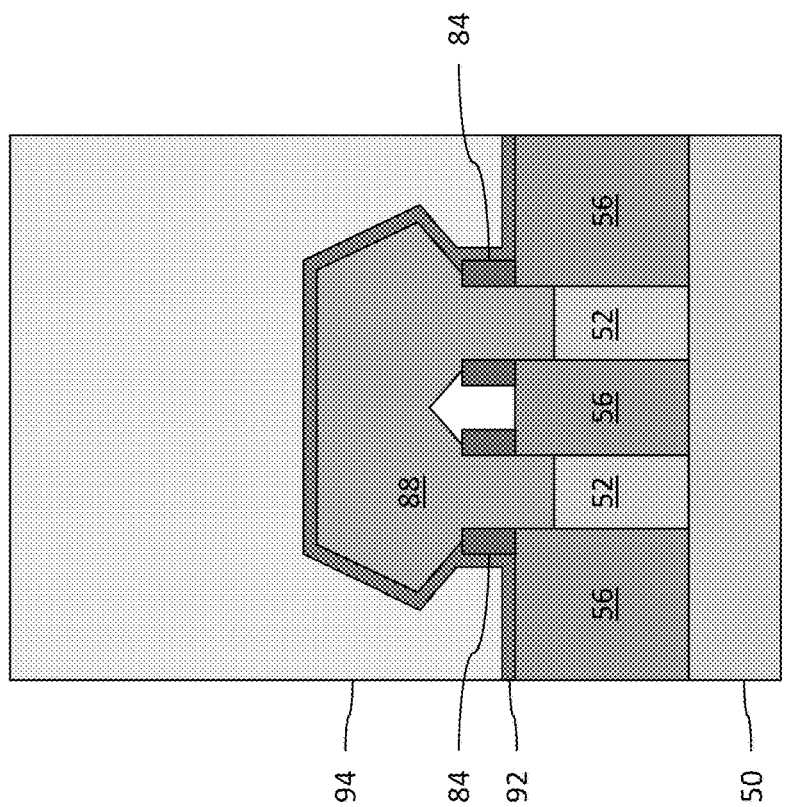
Figure 8B:
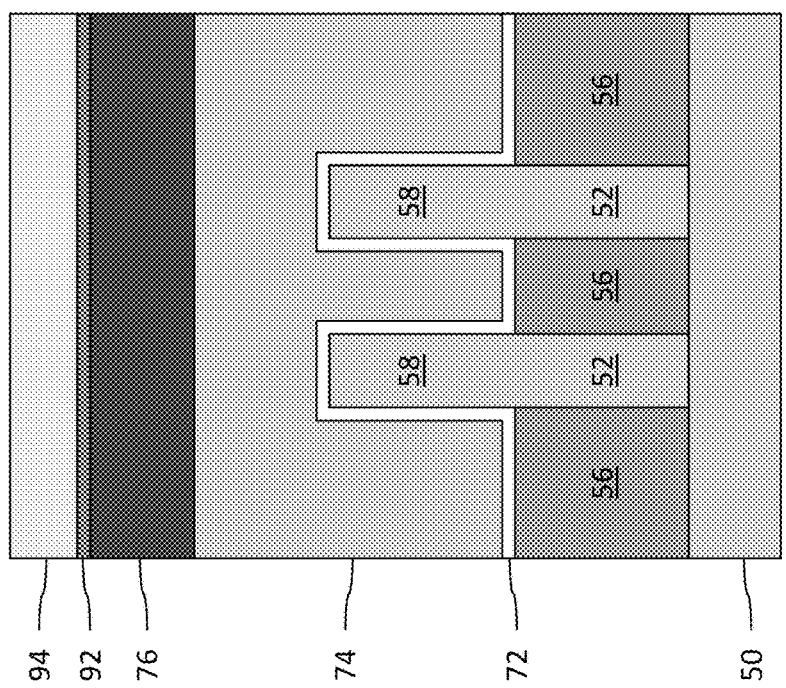

In FIGS. 8A-8C, a first inter-layer dielectric (ILD) 94 is deposited over the epitaxial source/drain regions 88, the gate spacers 82, and the masks 76 (if present) or the dummy gates 74. The first ILD 94 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 92 is formed between the first ILD 94 and the epitaxial source/drain regions 88, the gate spacers 82, and the masks 76 (if present) or the dummy gates 74. The CESL 92 may be formed of a dielectric material having a high etching selectivity from the etching of the first ILD 94. Acceptable dielectric materials may include silicon nitride, silicon carbonitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like.

Figure 9A:
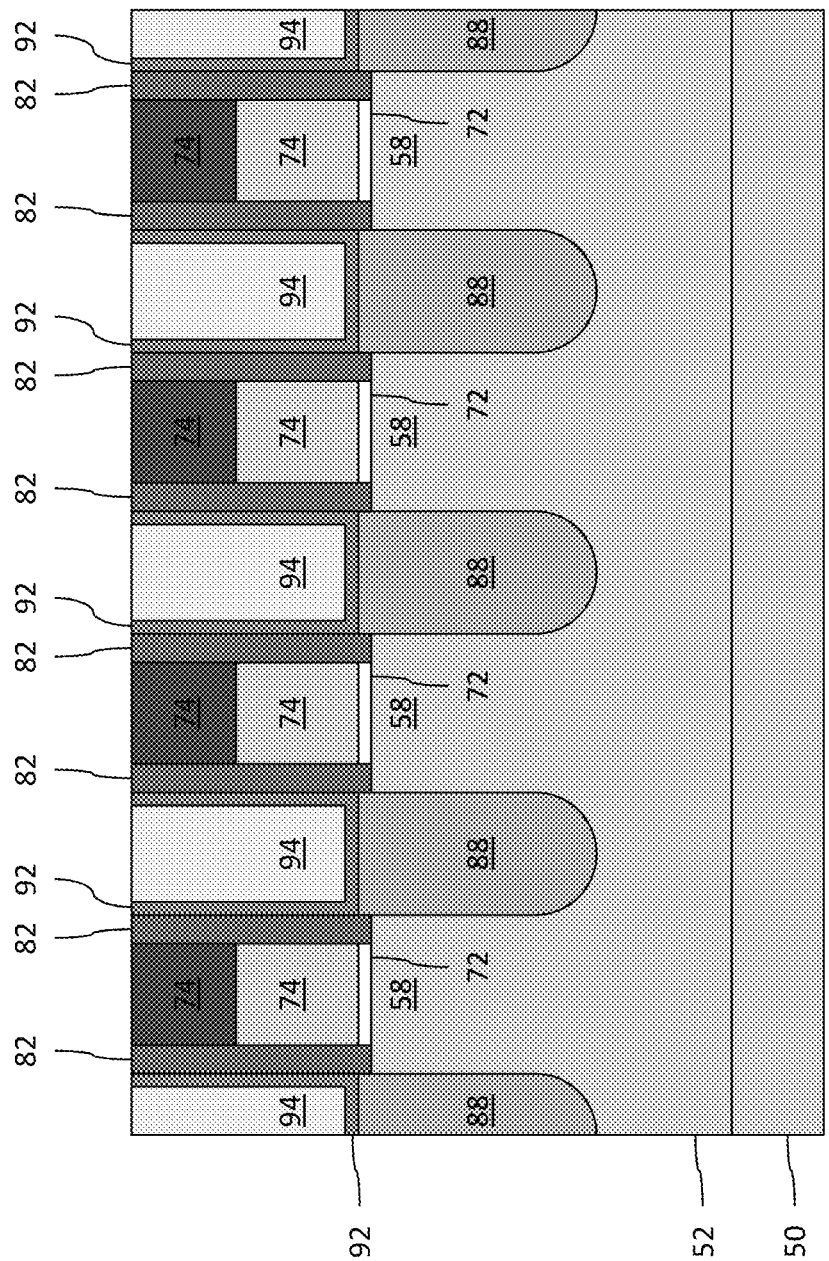
Figure 9C:
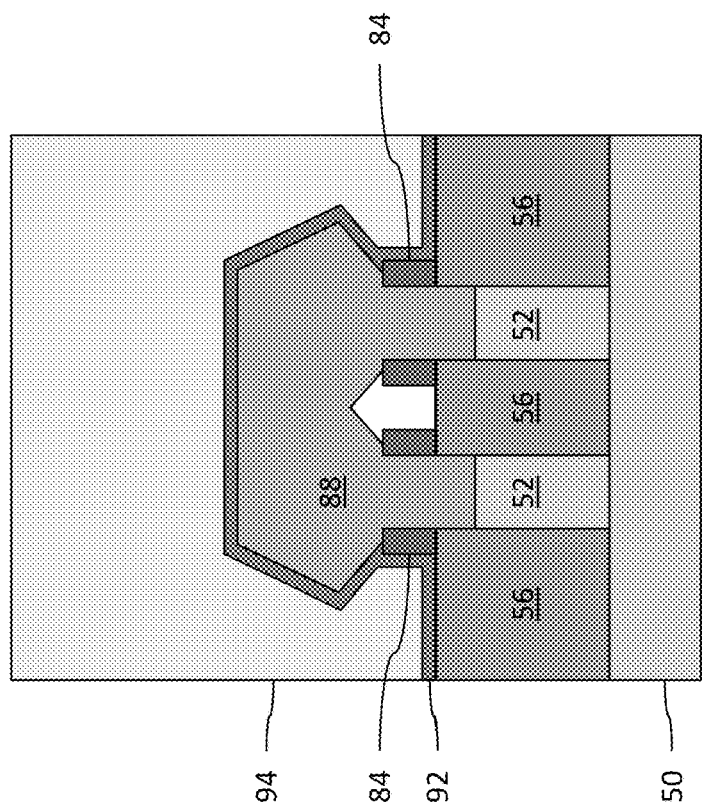
Figure 9B:
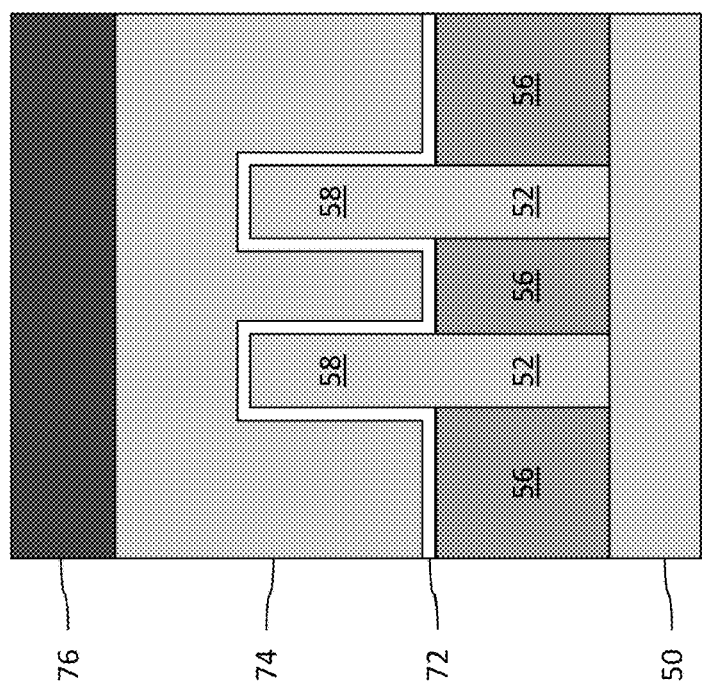

In FIGS. 9A-9C, a removal process is performed to level the top surfaces of the first ILD 94 with the top surfaces of the masks 76 (if present) or the dummy gates 74. In some embodiments, a planarization process such as a chemical mechanical polish (CMP), an etch-back process, combinations thereof, or the like may be utilized. The planarization process may also remove the masks 76 on the dummy gates 74, and portions of the gate spacers 82 along sidewalls of the masks 76. After the planarization process, the top surfaces of the first ILD 94, the CESL 92, the gate spacers 82, and the masks 76 (if present) or the dummy gates 74 are coplanar (within process variations). Accordingly, the top surfaces of the masks 76 (if present) or the dummy gates 74 are exposed through the first ILD 94. In the illustrated embodiment, the masks 76 remain, and the planarization process levels the top surfaces of the first ILD 94 with the top surfaces of the masks 76.

Figure 10A:
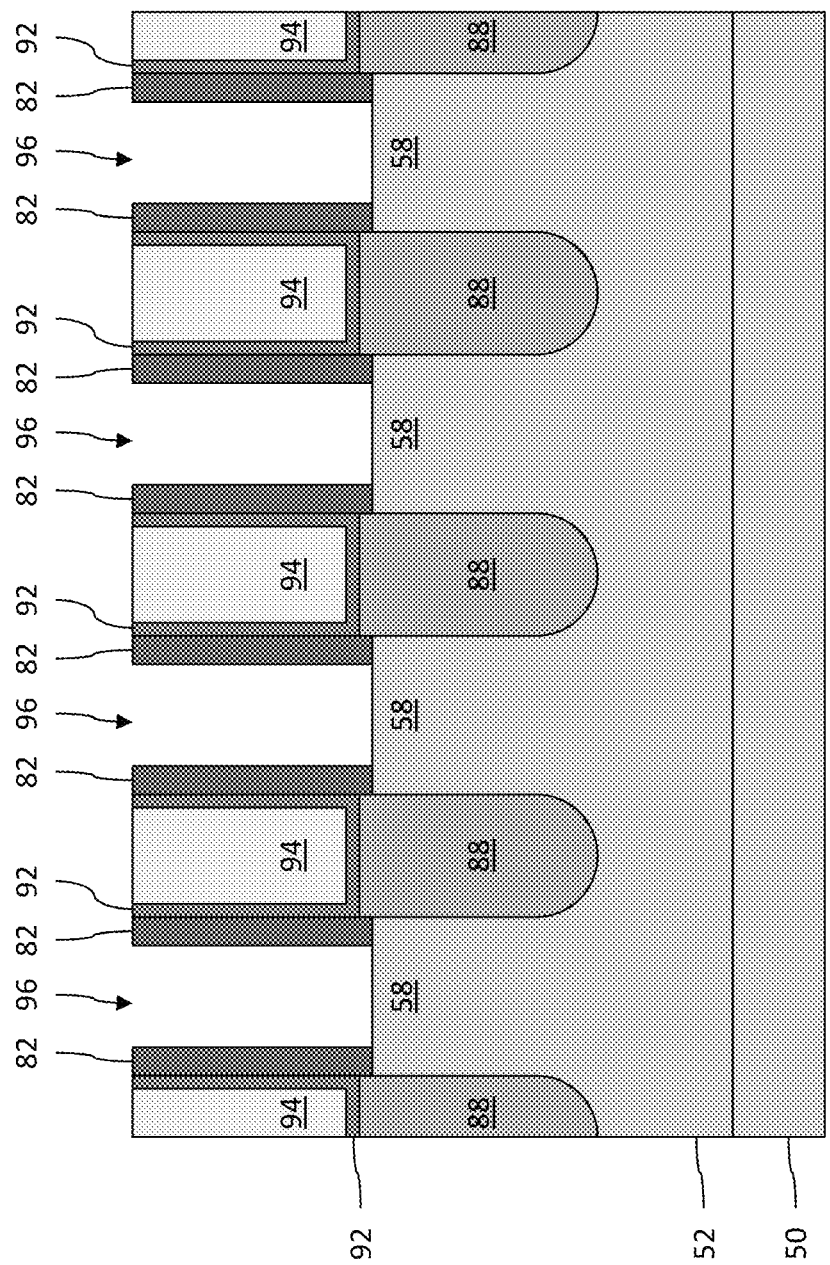
Figure 10C:
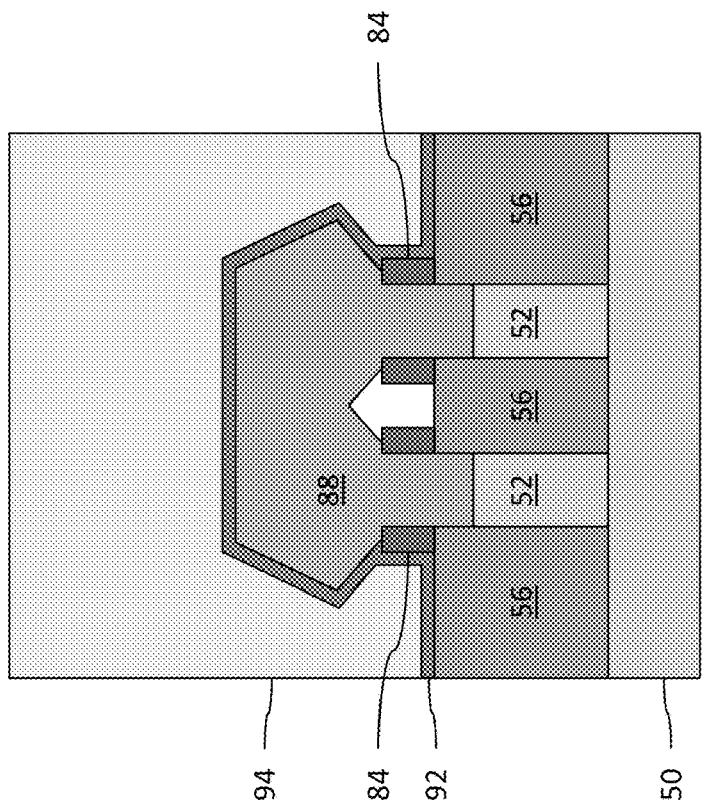
Figure 10B:
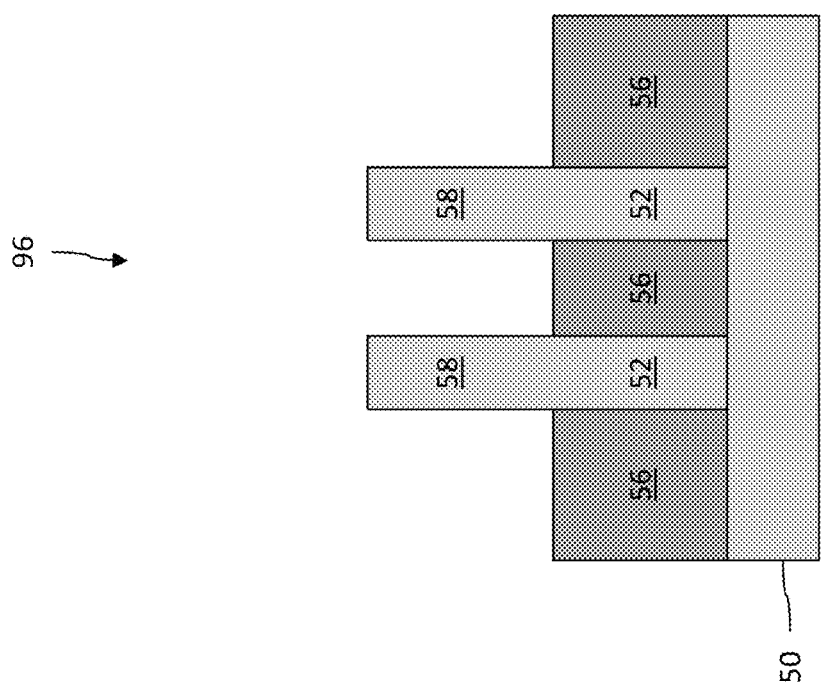

In FIGS. 10A-10C, the masks 76 (if present) and the dummy gates 74 are removed in an etching process, so that recesses 96 are formed. Portions of the dummy dielectrics 72 in the recesses 96 may also be removed. In some embodiments, only the dummy gates 74 are removed and the dummy dielectrics 72 remain and are exposed by the recesses 96. In some embodiments, the dummy dielectrics 72 are removed from recesses 96 in a first region of a die (e.g., a core logic region) and remain in recesses 96 in a second region of the die (e.g., an input/output region). In some embodiments, the dummy gates 74 are removed by an anisotropic dry etch process. For example, the etching process may include a dry etch process using reaction gas(es) that selectively etch the dummy gates 74 at a faster rate than the first ILD 94 or the gate spacers 82. During the removal, the dummy dielectrics 72 may be used as etch stop layers when the dummy gates 74 are etched. The dummy dielectrics 72 may then be optionally removed after the removal of the dummy gates 74. Each recess 96 exposes and/or overlies a channel region 58 of a respective fin 52.

Figure 11A:
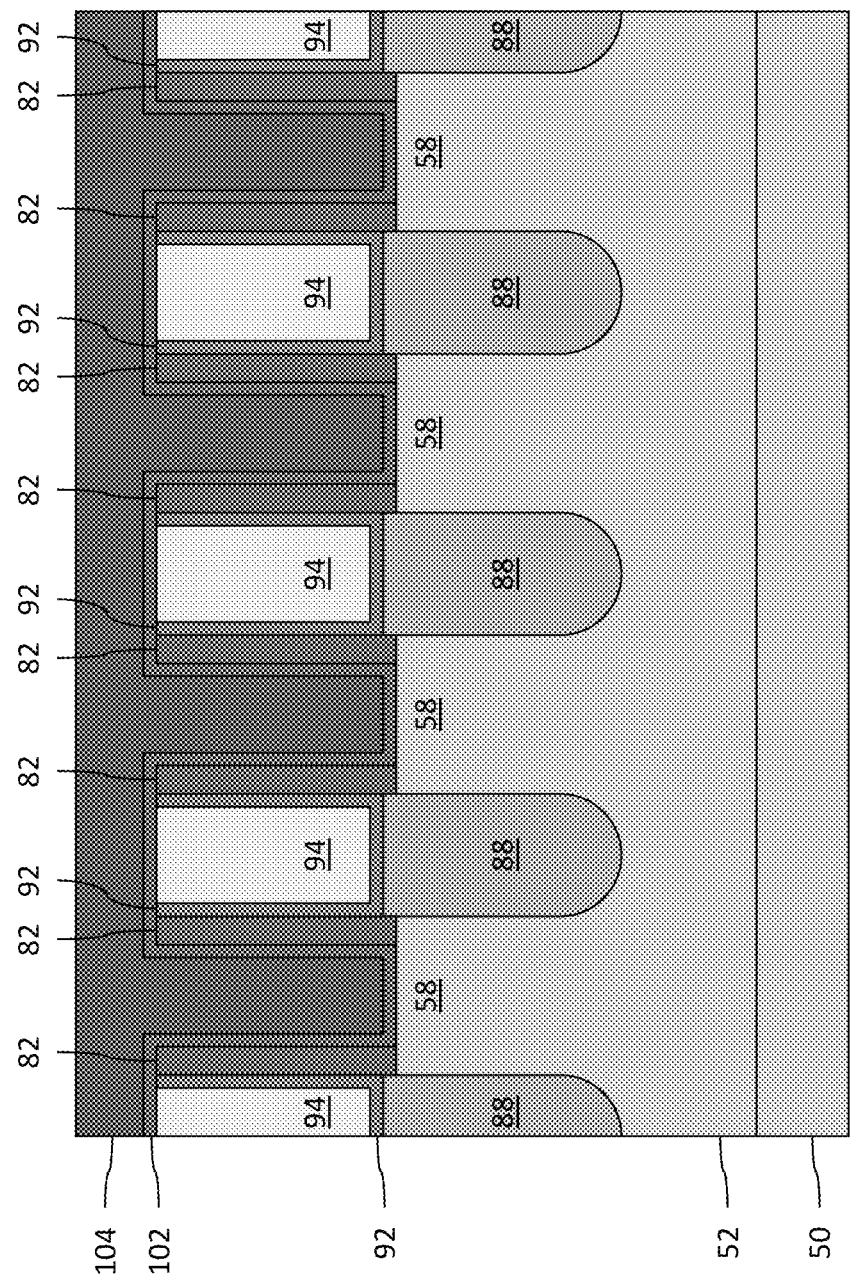
Figure 11C:
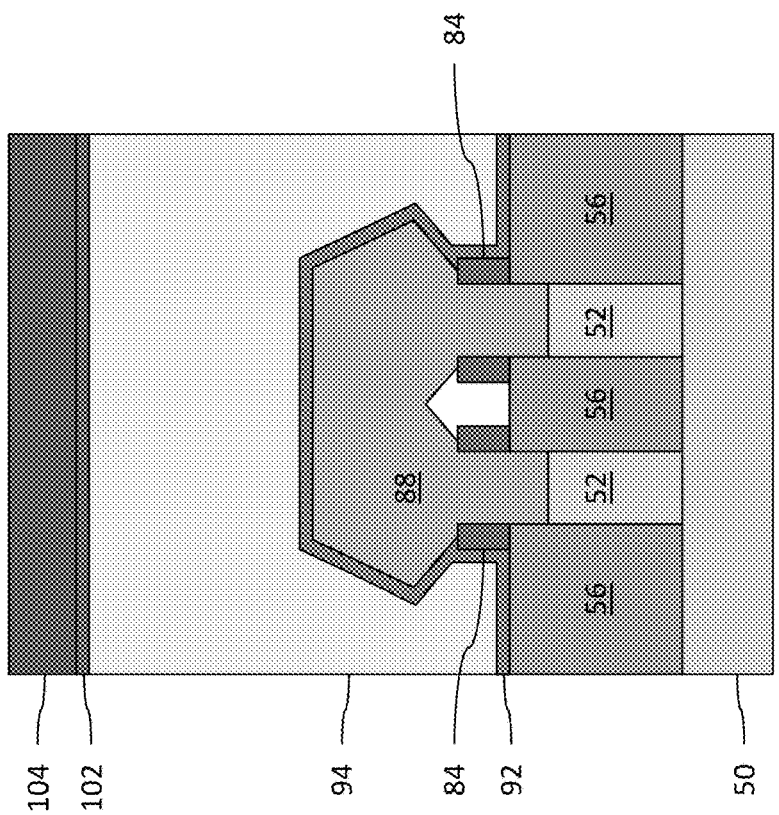
Figure 11B:
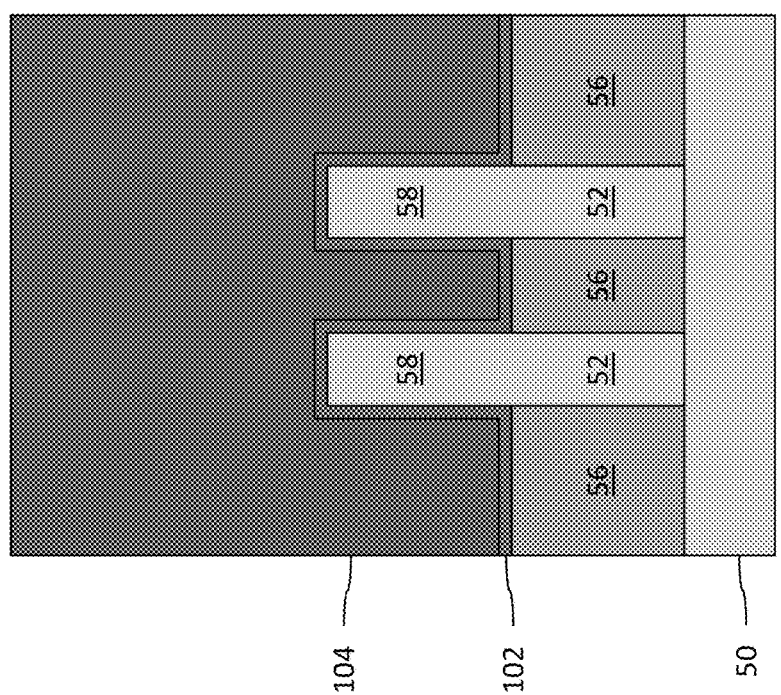

In FIGS. 11A-11C, a gate dielectric layer 102 is formed in the recesses 96. A gate electrode layer 104 is formed on the gate dielectric layer 102. The gate dielectric layer 102 and the gate electrode layer 104 are layers for replacement gates, and each extend along sidewalls and over top surfaces of the channel regions 58.

The gate dielectric layer 102 is disposed on the sidewalls and/or the top surfaces of the fins 52 and on the sidewalls of the gate spacers 82. The gate dielectric layer 102 may also be formed on the top surfaces of the first ILD 94 and the gate spacers 82. The gate dielectric layer 102 may include an oxide such as silicon oxide or a metal oxide, a silicate such as a metal silicate, combinations thereof, multi-layers thereof, or the like. The gate dielectric layer 102 may include a high-k dielectric material (e.g., a dielectric material having a k-value greater than 7.0), such as a metal oxide or a silicate of hafnium, aluminum, zirconium, lanthanum, manganese, barium, titanium, lead, and combinations thereof. The formation methods of the gate dielectric layer 102 may include molecular-beam deposition (MBD), ALD, PECVD, and the like. In embodiments where portions of the dummy dielectrics 72 remain in the recesses 96, the gate dielectric layer 102 includes a material of the dummy dielectrics 72 (e.g., silicon oxide). Although a single-layered gate dielectric layer 102 is illustrated, the gate dielectric layer 102 may include any number of interfacial layers and any number of main layers. For example, the gate dielectric layer 102 may include an interfacial layer and an overlying high-k dielectric layer.

The gate electrode layer 104 may include a metal-containing material such as titanium nitride, titanium oxide, tantalum nitride, tantalum carbide, tungsten, cobalt, ruthenium, aluminum, combinations thereof, multi-layers thereof, or the like. In some embodiments, the gate electrode layer 104 includes tantalum nitride that is rich in tantalum and tungsten. Although a single-layered gate electrode layer 104 is illustrated, the gate electrode layer 104 may include any number of work function tuning layers, any number of barrier layers, any number of glue layers, and a fill material.

The formation of the gate dielectric layer 102 in the n-type region 50N and the p-type region 50P may occur simultaneously such that the gate dielectric layer 102 in each region is formed of the same material(s), and the formation of the gate electrode layer 104 may occur simultaneously such that the gate electrode layer 104 in each region is formed of the same material(s). In some embodiments, the gate dielectric layers 102 in each region may be formed by distinct processes, such that the gate dielectric layers 102 may be different materials and/or have a different number of layers, and/or the gate electrode layers 104 in each region may be formed by distinct processes, such that the gate electrode layers 104 may be different materials and/or have a different number of layers. Various masking steps may be used to mask and expose appropriate regions when using distinct processes.

Figure 12A:
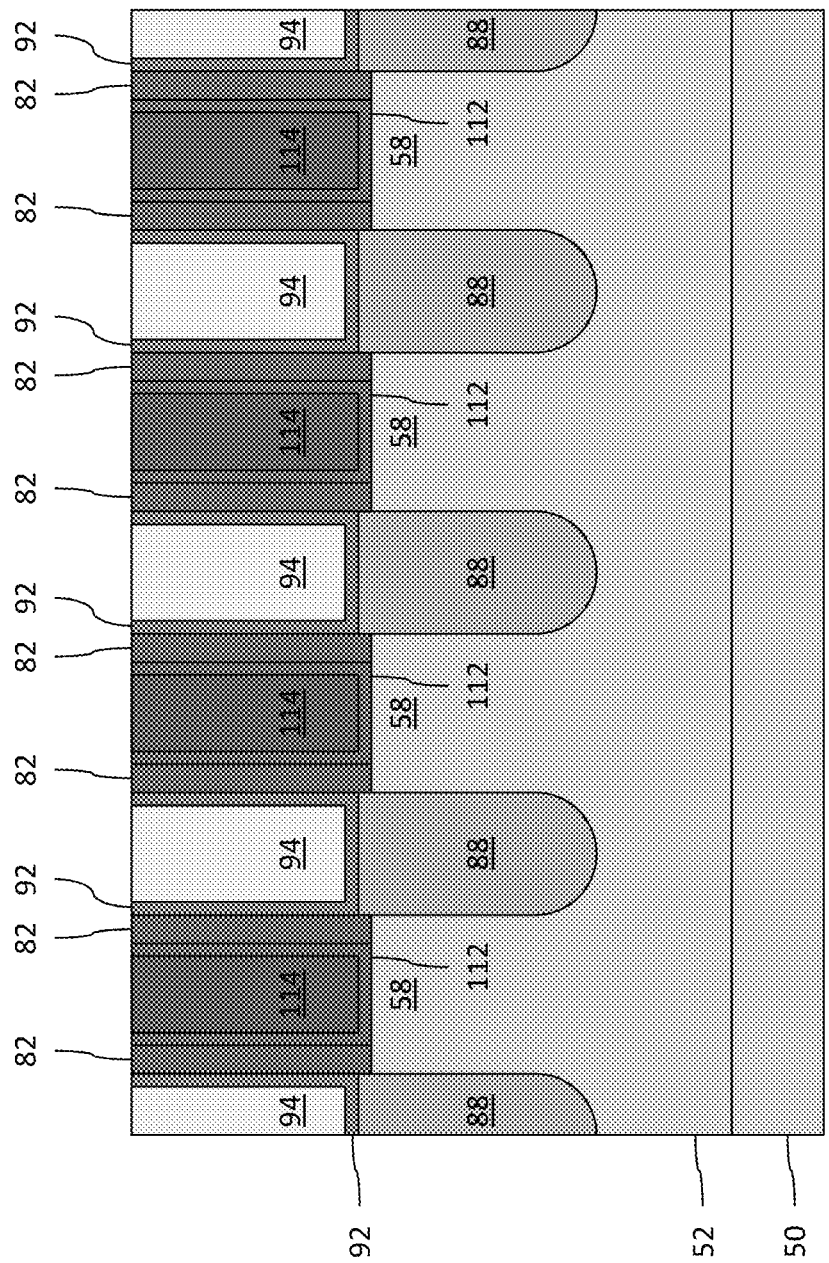
Figure 12C:
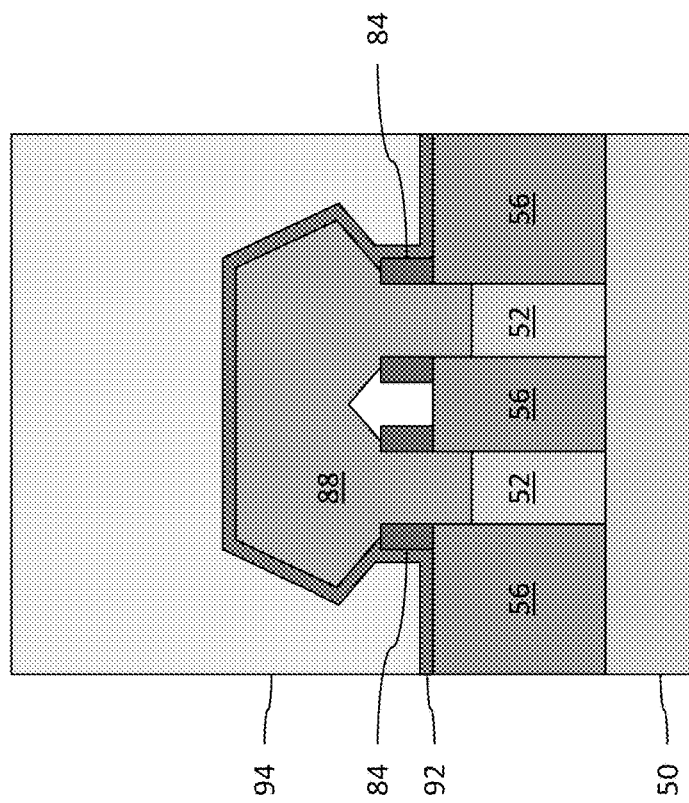
Figure 12B:
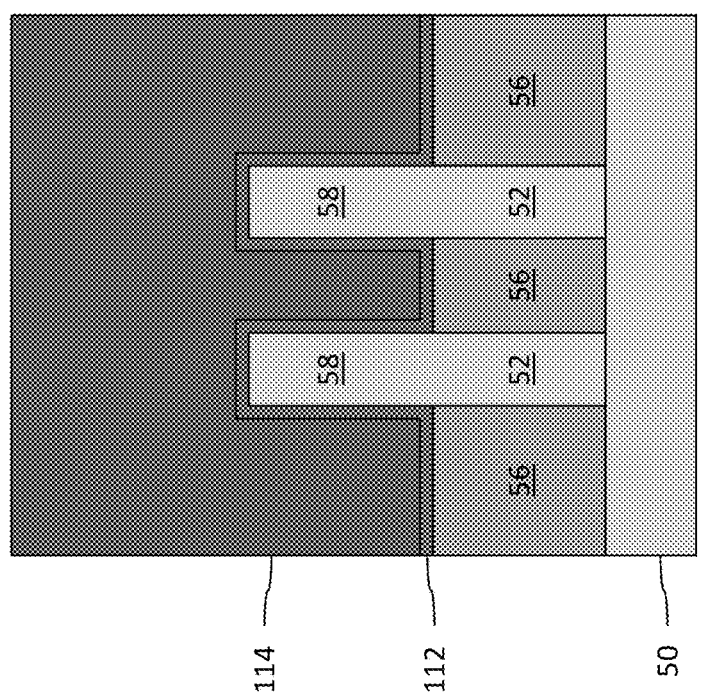

In FIGS. 12A-12C, a removal process is performed to remove the excess portions of the materials of the gate dielectric layer 102 and the gate electrode layer 104, which excess portions are over the top surfaces of the first ILD 94, the CESL 92, and the gate spacers 82, thereby forming gate dielectrics 112 and gate electrodes 114. In some embodiments, a planarization process such as a chemical mechanical polish (CMP), an etch-back process, combinations thereof, or the like may be utilized. The gate dielectric layer 102, when planarized, has portions left in the recesses 96 (thus forming the gate dielectrics 112). The gate electrode layer 104, when planarized, has portions left in the recesses 96 (thus forming the gate electrodes 114). After the planarization process, the top surfaces of the gate spacers 82, the CESL 92, the first ILD 94, the gate dielectrics 112, and the gate electrodes 114 are coplanar (within process variations). The gate dielectrics 112 and the gate electrodes 114 form replacement gates of the resulting FinFETs. Each respective pair of a gate dielectric 112 and a gate electrode 114 may be collectively referred to as a "gate structure." The gate structures each extend along top surfaces, sidewalls, and bottom surfaces of a channel region 58 of fins 52.

Figure 13A:
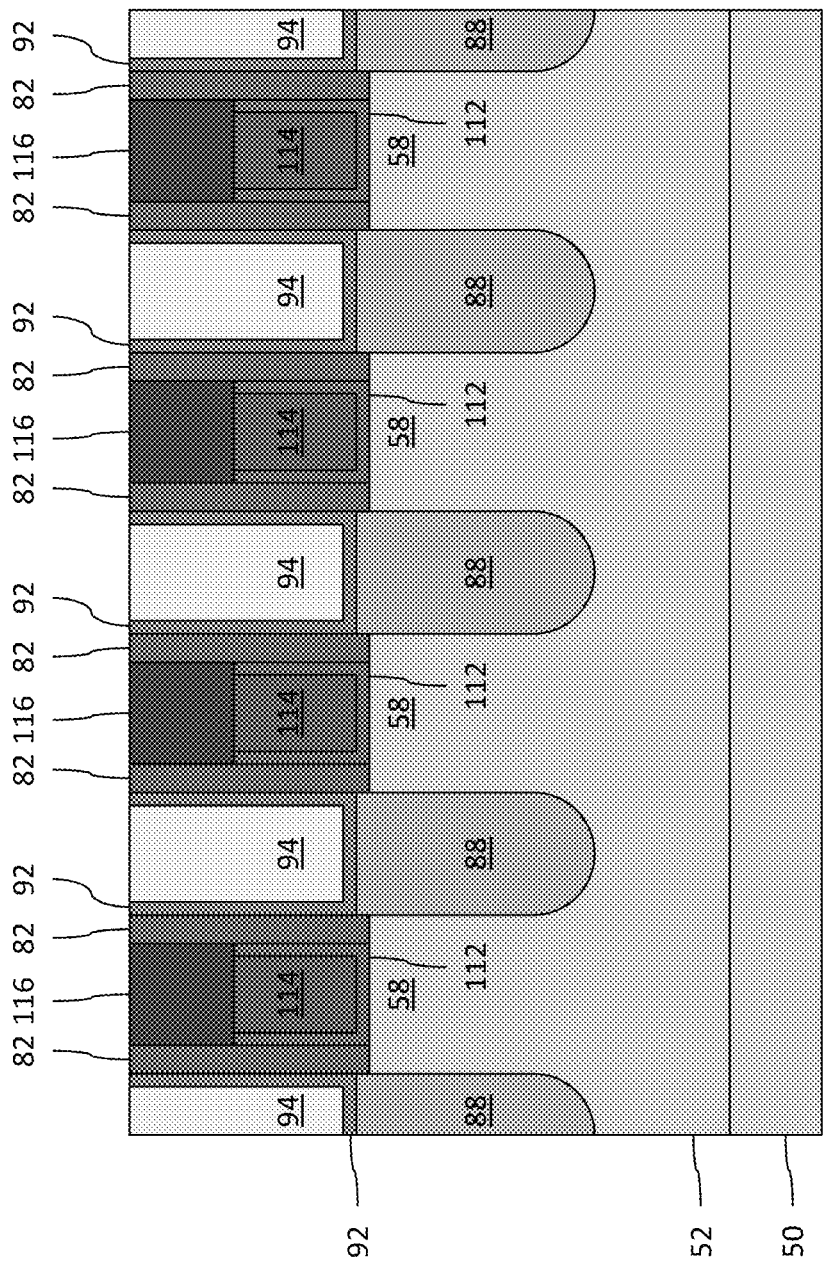
Figure 13C:
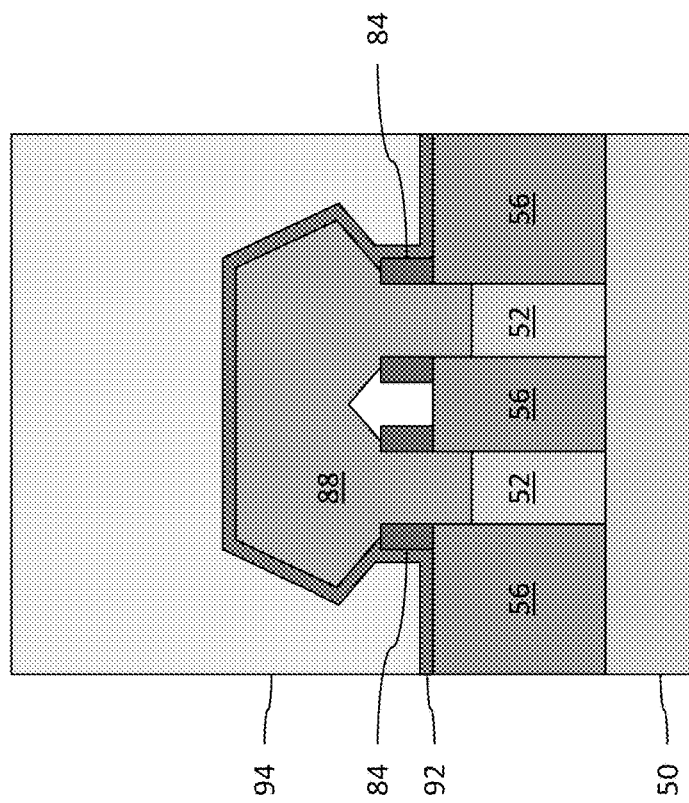
Figure 13B:
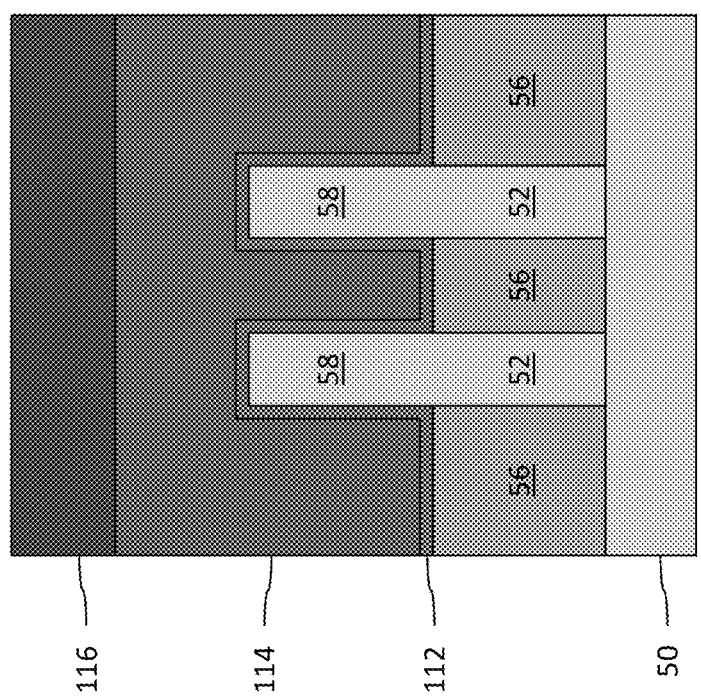

In FIG. 13A-13C, gate masks 116 are formed over the gate structures (including the gate dielectrics 112 and the gate electrodes 114). In some embodiments, the gate masks 116 may also be formed over the gate spacers 82 (subsequently described in greater detail for FIG. 21). The gate masks 116 are formed of one or more dielectric material(s) that have a high etching selectivity from the etching of the first ILD 94. Acceptable dielectric materials may include silicon nitride, silicon carbonitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. Gate contacts will be subsequently formed to penetrate through the gate masks 116 to contact the top surfaces of the gate electrodes 114.

As an example to form the gate masks 116, the gate structures (including the gate dielectrics 112 and the gate electrodes 114) may be recessed using any acceptable etching process. In some embodiments, the gate spacers 82 are also recessed. When the gate spacers 82 are recessed, they may be recessed the same amount as the gate structures, or may be recessed by a different amount. Dielectric material(s) are then conformally deposited in the recesses. A removal process is performed to remove the excess portions of the dielectric material(s), which excess portions are over the top surfaces of the first ILD 94, thereby forming the gate masks 116. In some embodiments, a planarization process such as a chemical mechanical polish (CMP), an etch-back process, combinations thereof, or the like may be utilized. The dielectric material(s), when planarized, have portions left in the recesses (thus forming the gate masks 116). After the planarization process, the top surfaces of the gate spacers 82, the CESL 92, the first ILD 94, and the gate masks 116 are coplanar (within process variations).

Figure 14A:
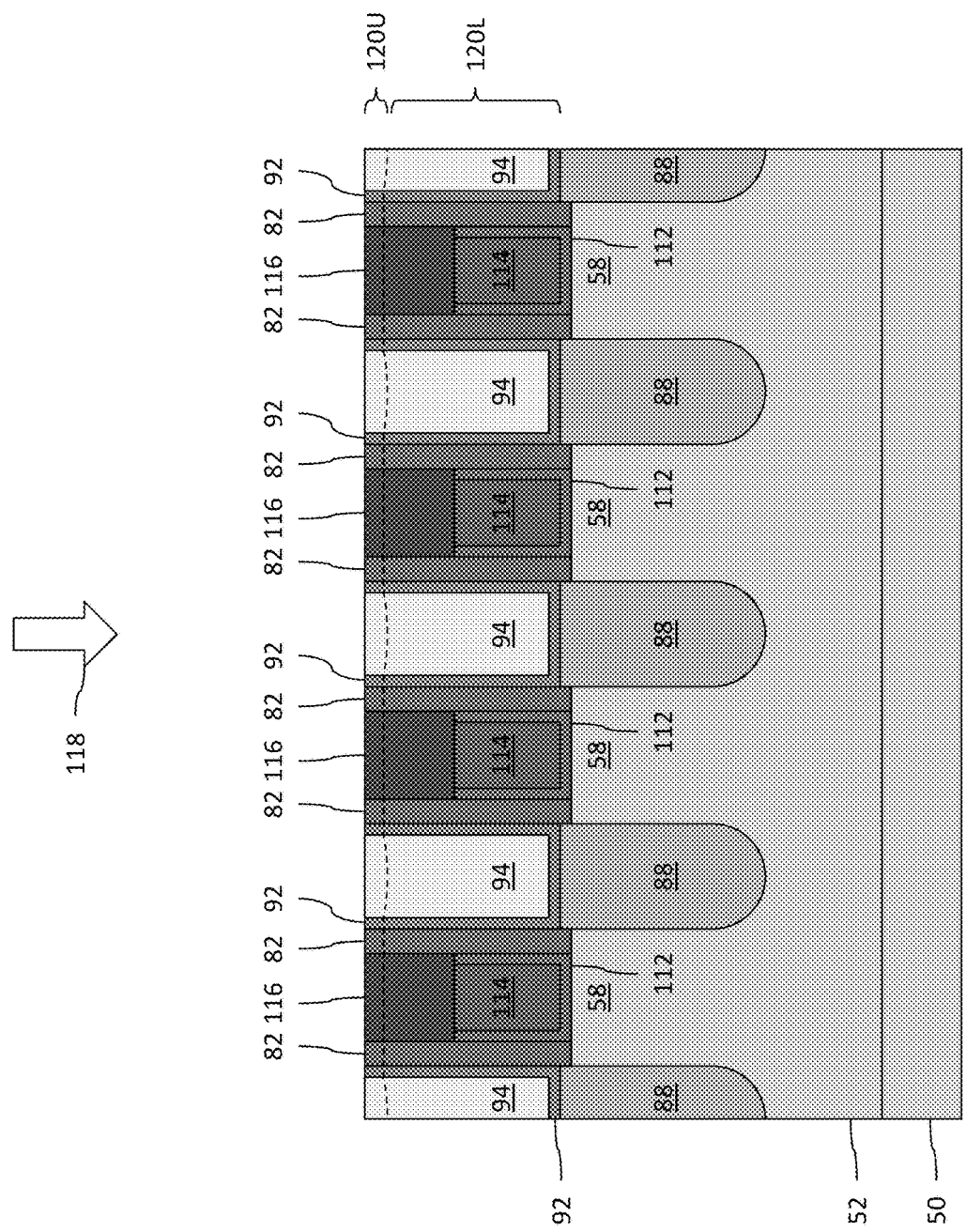
Figure 14C:
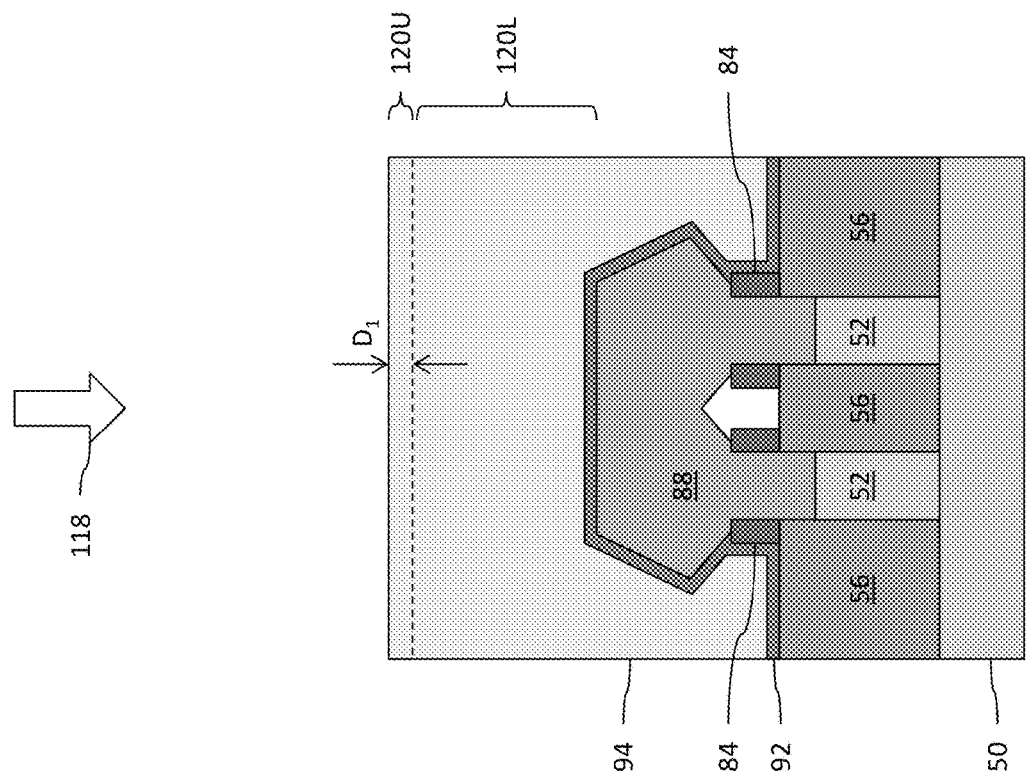
Figure 14B:
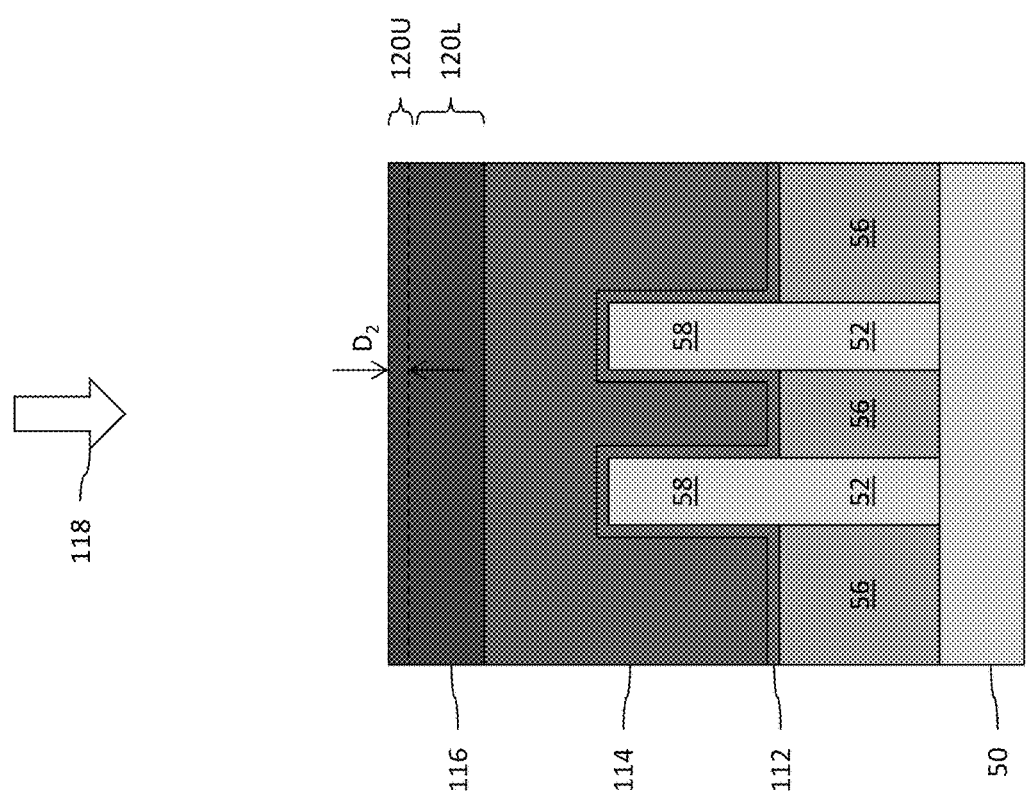

In FIG. 14A-14C, an impurity is implanted in upper regions 120U of the gate spacers 82, the CESL 92, and the gate masks 116, to modify an etch rate of those upper regions 120U. The impurity may also be implanted in upper regions 120U of the first ILD 94. The impurity may be boron, phosphorous, arsenic, germanium, carbon, silicon, argon, xenon, or the like. In embodiments where the gate spacers 82, the CESL 92, and the gate masks 116 are each formed of a nitride (e.g., silicon nitride, silicon carbonitride, silicon oxynitride, silicon oxycarbonitride, etc.), the impurity may be boron or phosphorous, and implantation may be by an implantation process 118. As such, the gate spacers 82, the CESL 92, and the gate masks 116 may each comprise a same dielectric material and the impurity.

The upper regions 120U of the various features are impurity-rich. For example, the upper regions 120U of the gate spacers 82, the CESL 92, and the gate masks 116 can each include a nitride having a greater concentration (by atomic percent) of boron or phosphorous than the lower regions 120L of the gate spacers 82, the CESL 92, and the gate masks 116. As will be subsequently described in greater detail, contact openings will be etched in the first ILD 94 to expose the epitaxial source/drain regions 88. The modified (e.g., impurity-rich) upper regions 120U of the gate spacers 82, the CESL 92, and the gate masks 116 have a high etching selectivity from the etching of the first ILD 94, thereby helping reduce losses of the gate spacers 82, the CESL 92, and the gate masks 116 during the etching of the contact openings in the first ILD 94.

The lower regions 120L of the gate spacers 82, the CESL 92, the first ILD 94, and the gate masks 116 remain unmodified or less modified during/after the impurity implantation, as compared to the upper regions 120U. In some embodiments, the lower regions 120L retain their initial composition, such that the final composition of the lower regions 120L is the same as the initial composition of the lower regions 120L. Thus, the lower regions 120L may be substantially free of the impurity. In some embodiments, the lower regions 120L are modified, but are less modified than the upper regions 120U, so that the final composition of the lower regions 120L is closer to their initial composition than the final composition of the upper regions 120U. Thus, the lower regions 120L may comprise the impurity. As will be subsequently described in greater detail, the average concentration of the implanted impurity in the upper regions 120U may be several orders of magnitude greater than the average concentration of the implanted impurity in the lower regions 120L. For example, the impurity concentration in the upper regions 120U may be from $10^3$ to $10^4$ times greater than the impurity concentration in the lower regions 120L. The change in average concentration of the impurity between the upper regions 120U and the lower regions 120L may be abrupt or may be gradual. More generally, the concentration of the impurity in the various features forms a gradient in which the concentration decreases in a direction extending from the upper regions 120U to the lower regions 120L of the various features.

As noted above, the gate spacers 82, the CESL 92, and the gate masks 116 may each be formed of a nitride (e.g., silicon nitride, silicon carbonitride, silicon oxynitride, silicon oxycarbonitride, etc.) and the first ILD 94 may be formed of an oxide (e.g., silicon oxide). The implantation process 118 may implant more impurities into oxides than into nitrides, such that the upper regions 120U of the first ILD 94 have a greater depth and impurity concentration than the upper regions 120U of the gate spacers 82, the CESL 92, and the gate masks 116. For example, the upper regions 120U of the first ILD 94 can have a depth $D_1$ (see FIG. 14C) in the range of 0 nm to 6 nm and can have an impurity concentration in the range of $10^{18}$ $cm^{-3}$ to $10^{22}$ $cm^{-3}$, while the upper regions 120U of the gate masks 116 can have a depth $D_2$ (see FIG. 14B) in the range of 0 nm to 4 nm and can have an impurity concentration in the range of $10^{15}$ $cm^{-3}$ to $10^{16}$ $cm^{-3}$. Implanting the upper regions 120U of the gate masks 116 to an impurity concentration in this range provides sufficient etching selectivity from the etching of the first ILD 94 without decreasing device performance. Implanting the upper regions 120U of the gate masks 116 to an impurity concentration outside of this range may not provide sufficient etching selectivity from the etching of the first ILD 94 without decreasing device performance.

In some embodiments, the implantation process 118 includes a hot implantation process. Specifically, the hot implantation process may be performed by placing the substrate 50 on an implanter platen, and impinging the impurity into the gate spacers 82, the CESL 92, the first ILD 94, and the gate masks 116 while controlling the temperature of the implanter platen. The impurity can be implanted at a high energy, such as an implantation energy in the range of 0.5 keV to 10 keV. The implanter platen can be controlled to a temperature in the range of −100° C. to 500° C. Implanting the impurities with a hot implantation process helps reduce surface oxidation of the gate spacers 82, the CESL 92, and the gate masks 116 during the implantation process 118, thereby further increasing their etching selectivity with the first ILD 94. Performing the hot implantation process with parameters in these ranges allows the upper regions 120U of the gate spacers 82, the CESL 92, and the gate masks 116 to be implanted to a desired impurity concentration (previously described) while avoiding implant damage. Performing the hot implantation process with parameters outside of these ranges may not allow the upper regions 120U of the gate spacers 82, the CESL 92, and the gate masks 116 to be implanted to a desired impurity concentration while avoiding implant damage.

In some embodiments, the implantation process 118 further includes an annealing process after the hot implantation process. The annealing process may be a melting laser annealing (MLA), a dynamic surface annealing (DSA), or the like. In some embodiments, the annealing process is a melting laser annealing performed at a temperature in the range of 800° C. to 1000° C., and for a duration in the range of 1 µs to 10 µs. In some embodiments, the annealing process is a dynamic surface annealing performed at a temperature in the range of 850° C. to 900° C., and for a duration in the range of 0.1 ms to 1 ms. Performing an annealing process repairs implant damage and activates the implanted impurity. Specifically, the annealing process promotes bonding of the impurity (e.g., boron or phosphorous) to nitrides (e.g., the gate spacers 82, the CESL 92, and the gate masks 116). Increasing bonding of the impurity in the gate spacers 82, the CESL 92, and the gate masks 116 helps increase their etching selectivity with the first ILD 94.

Figure 24:
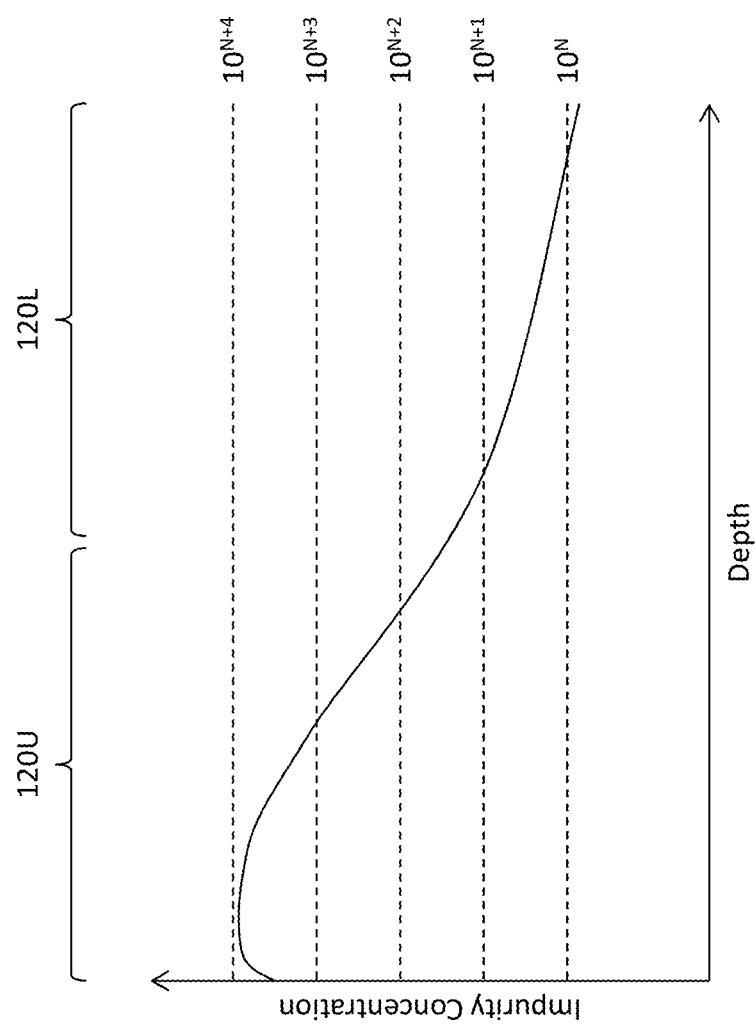
FIG. 24 is a graph of experimental data obtained from an implantation process in the manufacturing of FinFETs.

FIG. 24 is a graph of experimental data obtained from an implantation process 118. The concentration of the implanted impurity is plotted as a function of the depth from the top surface of the first ILD 94. As shown, the impurity concentration in the upper regions 120U is several orders of magnitude greater than the impurity concentration in the lower regions 120L.

Figure 15A:
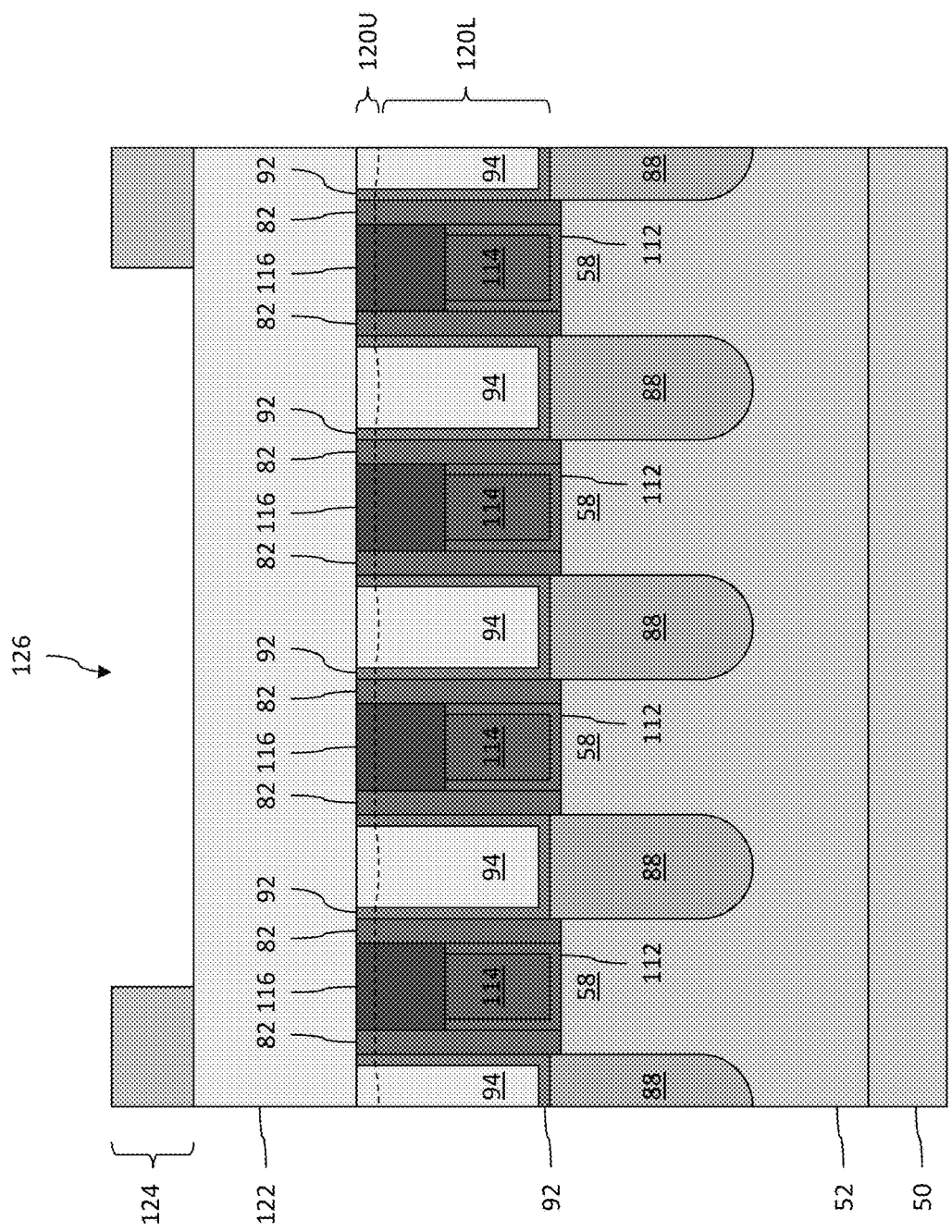
Figure 15C:
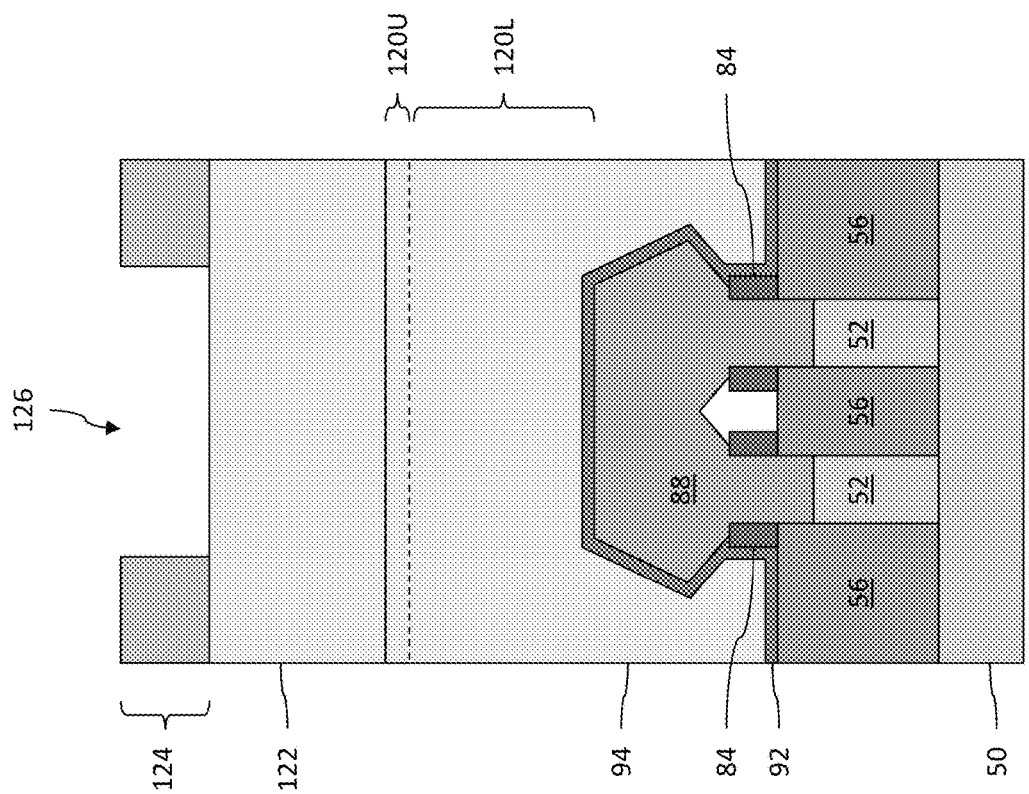
Figure 15B:
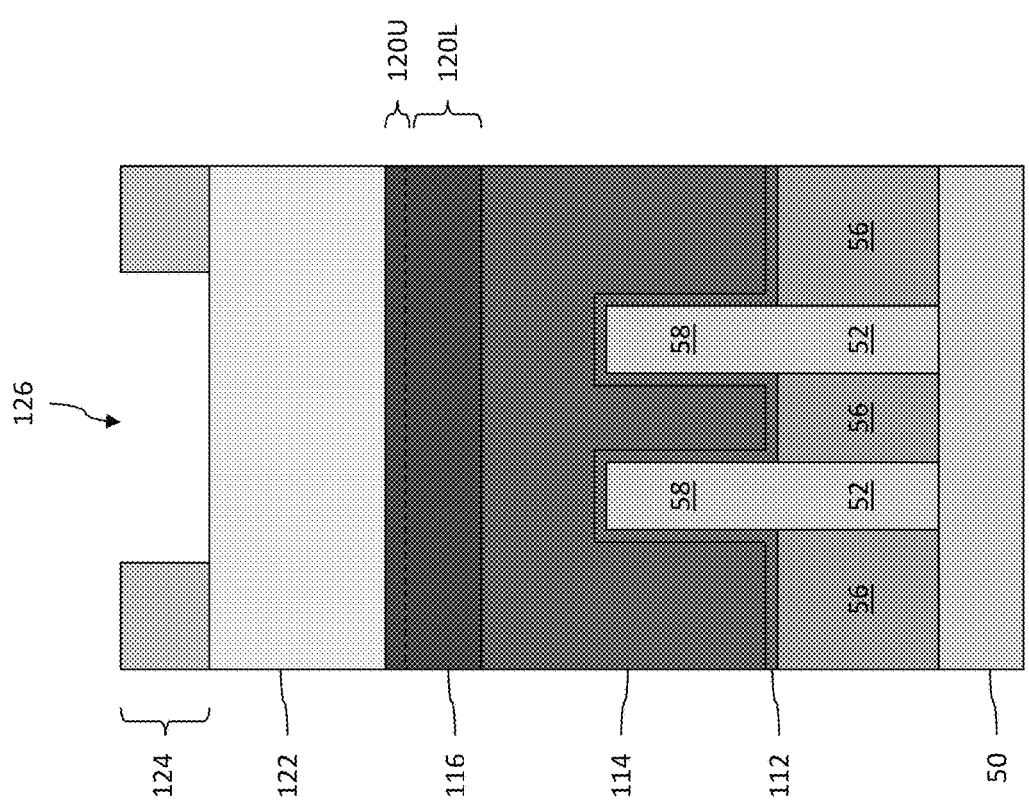

In FIG. 15A-15C, a dielectric layer 122 is optionally formed over the gate spacers 82, the CESL 92, the first ILD 94, and the gate masks 116. The dielectric layer 122 may be referred to as a pad layer. The dielectric layer 122 may be formed of an oxide such as silicon oxide, aluminum oxide, or the like, which may be deposited by CVD, ALD, or the like.

A mask 124 is formed on the dielectric layer 122 (if present), and over the gate spacers 82, the CESL 92, the first ILD 94, and the gate masks 116. The mask 124 may be formed by depositing one or more masking layer(s) on the dielectric layer 122 and patterning the masking layer(s) with slot openings 126. The masking layer(s) may each be formed of a material that includes a metal (e.g., titanium nitride, titanium, tantalum nitride, tantalum, a metal-doped carbide (e.g., tungsten carbide), or the like) and/or a metalloid (e.g., silicon nitride, boron nitride, silicon carbide, or the like), which may be formed by a deposition process such as CVD, ALD, or the like. In some embodiments, the masking layer(s) include a lower masking layer and an upper masking layer, with the lower masking layer formed of a metal, and with the upper masking layer formed of an oxide such as a tetraethylorthosilicate (TEOS) oxide, a nitrogen-free antireflective coating (NFARC), or the like. The masking layer(s) may be patterned with the slot openings 126 using acceptable photolithography techniques to form the mask 124. The slot openings 126 are strips that run parallel to the lengthwise directions of the fins 52, overlapping the CESL 92, the first ILD 94, and the gate masks 116. Specifically, the slot openings 126 extend over multiple gate structures (including the gate dielectrics 112 and the gate electrodes 114) and multiple epitaxial source/drain regions 88.

Figure 16A:
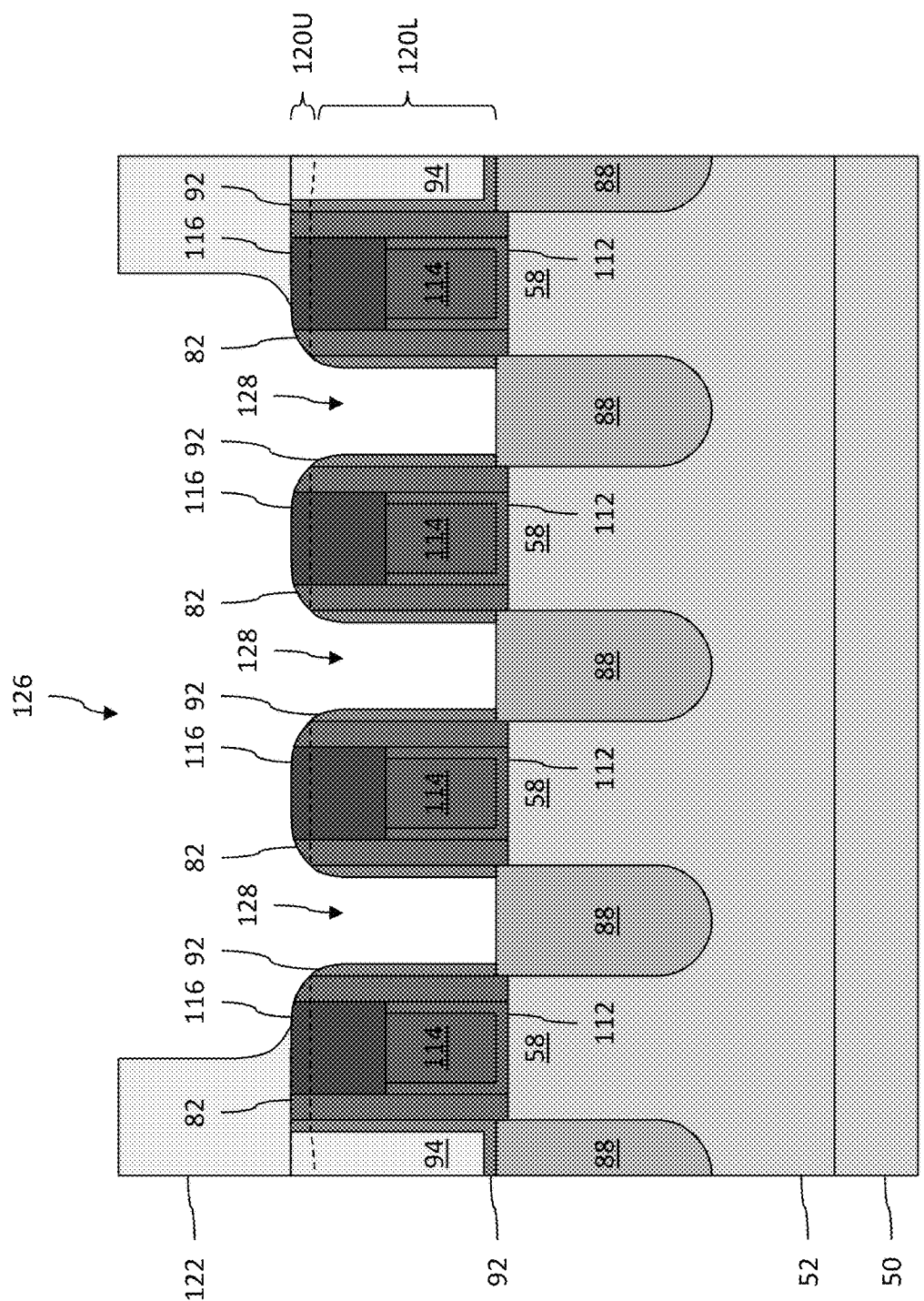
Figure 16C:
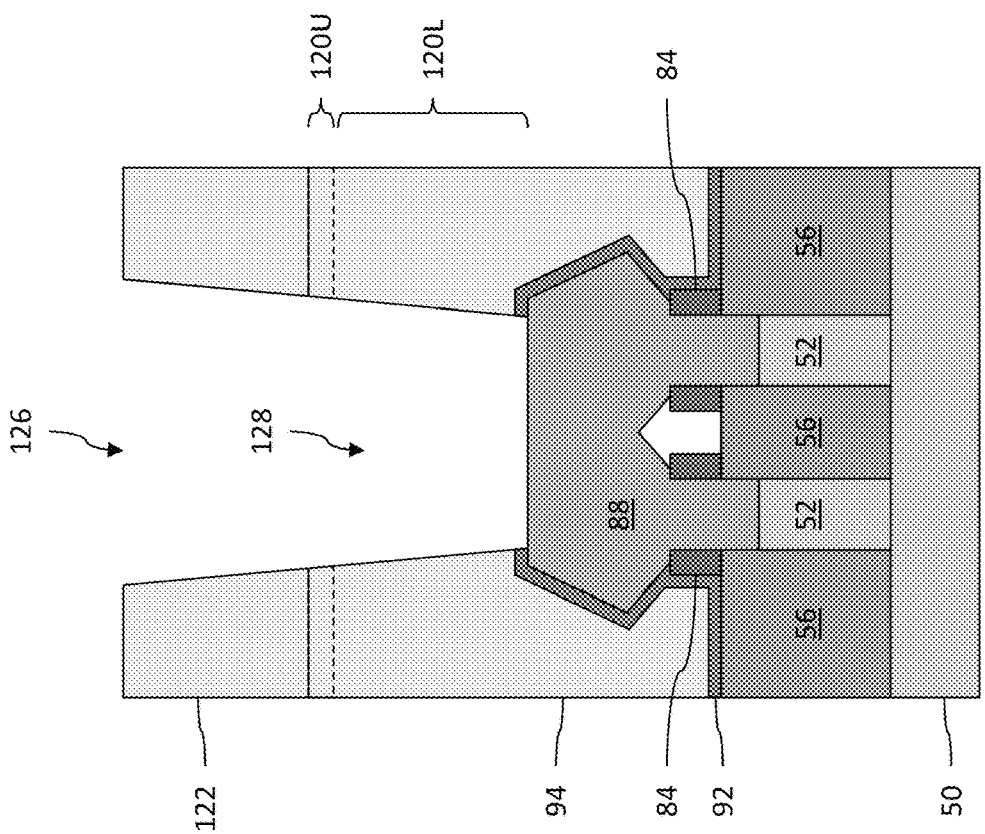
Figure 16B:
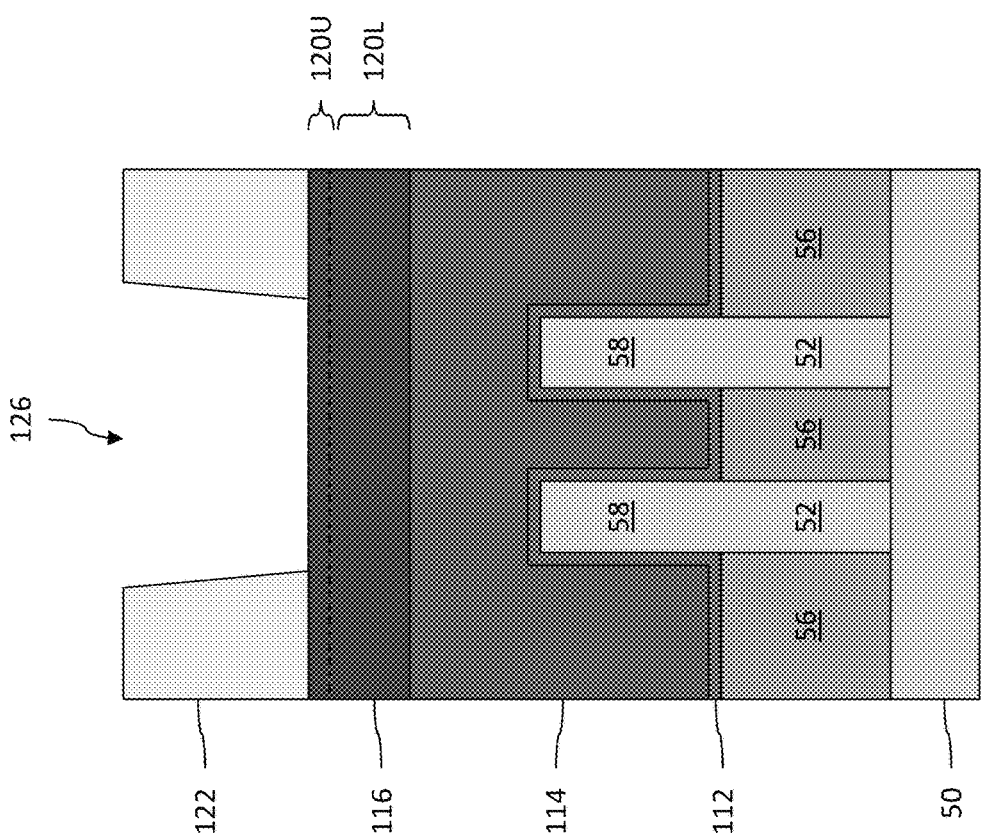

In FIGS. 16A-16C, the first ILD 94 is etched using the mask 124 as an etching mask and using the CESL 92 as an etch stop layer to form contact openings 128 for source/drain contacts. The etching may be any acceptable etching process, such as one that is selective to the material of the first ILD 94 (e.g., selectively etches the material of the first ILD 94 at a faster rate than the material(s) of the gate spacers 82, the CESL 92, and the gate masks 116). The etching process may be anisotropic. Thus, the slot openings 126 are extended through the dielectric layer 122 (if present), and the portions of the first ILD 94 uncovered by the mask 124 (e.g., exposed by the slot openings 126) are etched to form the contact openings 128. The contact openings 128 are then extended through the CESL 92 by any acceptable etching process to expose the epitaxial source/drain regions 88. After the etching processes, the mask 124 may be removed, such as by any acceptable ashing process. The gate masks 116 cover the gate structures (including the gate dielectrics 112 and the gate electrodes 114) during etching, thereby protecting the gate structures during the etching of the contact openings 128.

The etching process for forming the contact openings 128 is a self-aligned contact (SAC) etching process, in which the gate spacers 82, the CESL 92, and the gate masks 116 are exposed to etchants during the etching of the contact openings 128. Depending on the selectivity of the etching processes used to form the contact openings 128, some losses of the gate spacers 82, the CESL 92, and/or the gate masks 116 occurs such that the sidewalls and top surfaces of the gate spacers 82, the CESL 92, and/or the gate masks 116 are rounded after etching. However, as noted above, the upper regions 120U of the gate spacers 82, the CESL 92, and the gate masks 116 include an impurity implanted by the implantation process 118 (see FIGS. 14A-14C). In embodiments where the gate spacers 82, the CESL 92, and the gate masks 116 are each formed of a nitride (e.g., silicon nitride, silicon carbonitride, silicon oxynitride, silicon oxycarbonitride, etc.), the impurity may be boron or phosphorous, and implantation may be by an implantation process 118. The upper regions 120U of the gate spacers 82, the CESL 92, and the gate masks 116 with the impurity have a high etching selectivity from the etching of the first ILD 94. Thus, losses of the gate spacers 82, the CESL 92, and the gate masks 116 may be reduced during the etching processes used to form the contact openings 128. Although some rounding of the gate spacers 82, the CESL 92, and/or the gate masks 116 may occur, the amount of rounding is small. In some embodiments, the gate spacers 82, the CESL 92, and the gate masks 116 collectively have rounded sidewalls that connect the straight sidewalls of the CESL 92 to the top surfaces of the gate masks 116, and the rounded sidewalls have an arc length in the range of 5 nm to 15 nm. Reducing losses of the gate spacers 82, the CESL 92, and the gate masks 116 during etching of the contact openings 128 helps reduce leakage between the subsequently formed source/drain contacts and the gate electrodes 114. Device performance may thus be improved.

Figure 25:
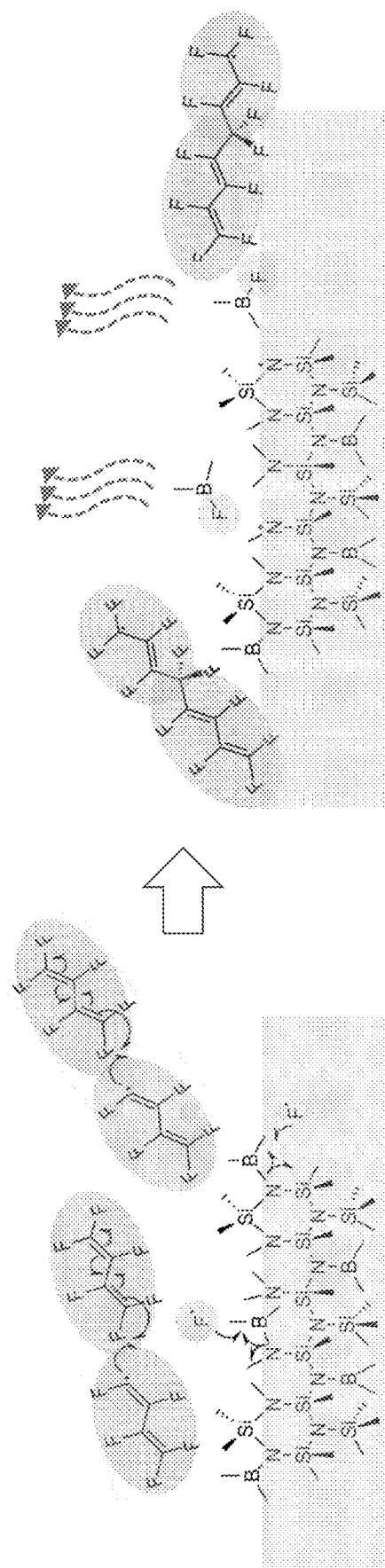
FIG. 25 illustrates a reaction during contact opening etching in the manufacturing of FinFETs.

In some embodiments, the first ILD 94 is etched by a dry etch using a fluorocarbon ($C_xF_y$) based etchant. In one example, the gate spacers 82, the CESL 92, and the gate masks 116 may each be formed of a nitride (e.g., silicon nitride, silicon carbonitride, silicon oxynitride, silicon oxycarbonitride, etc.), the first ILD 94 may be formed of an oxide (e.g., silicon oxide), the impurity is boron, and the first ILD 94 is etched with $C_4F_6$ while generating a plasma. During the plasma generation, fluorine breaks away from the $C_4F_6$ to form $C_4F_5^*$ radicals and $F^*$ radicals according to Equation 1. The $F^*$ radicals attack both Si—N bonds and Si—B bonds in the material(s) of the gate spacers 82, the CESL 92, and the gate masks 116 to break those bonds, so that the $F^*$ radicals bond to open $N^-$ and $B^-$ atoms according to Equations 2 and 3, respectively. The $F^*$ radicals also bond to open Si atoms. The products of these reactions may be evacuated, e.g., with a vacuum. $F^*$ radicals react faster with boron than with nitrogen. The inclusion of boron in the material(s) of the gate spacers 82, the CESL 92, and the gate masks 116 speeds up the consumption of $F^*$ radicals so that less $F^*$ radicals can recombine with the $C_4F_5^*$ radicals. The $C_4F_5^*$ radicals react on the surfaces of the gate spacers 82, the CESL 92, and the gate masks 116 to form a polymer byproduct (e.g., $(C_4F_5)_6$) on those surfaces according to Equation 4. The polymer byproduct is thus a byproduct of the SAC etching process. An example of the reaction described by Equations 1-4 to form the polymer byproduct is illustrated in FIG. 25. The polymer byproduct is substantially inert to etching, and acts as a protective layer over the surfaces of the gate spacers 82, the CESL 92, and the gate masks 116 during the etching of the contact openings 128. Including the impurity in the material(s) of the gate spacers 82, the CESL 92, and the gate masks 116 promotes formation of the polymer byproduct during the SAC etching process, resulting in a thicker protective layer. For example, the protective layer can have a thickness of up to 200 Å, such as a thickness in the range of 0 Å to 200 Å. Forming a thicker protective layer provides more protection from etching, thereby reducing loss of the gate spacers 82, the CESL 92, and/or the gate masks 116 during etching of the contact openings 128.

$$6C_4F_6 \rightarrow 6C_4F_5^* + 6F^* \quad (1)$$

$$N^- + 3F^* \rightarrow NF_3 \quad (2)$$

$$B^- + 3F^* \rightarrow BF_3 \quad (3)$$

$$6C_4F_5^* \rightarrow (C_4F_5)_6 \rightarrow C_xF_y \quad (4)$$

Figure 17A:
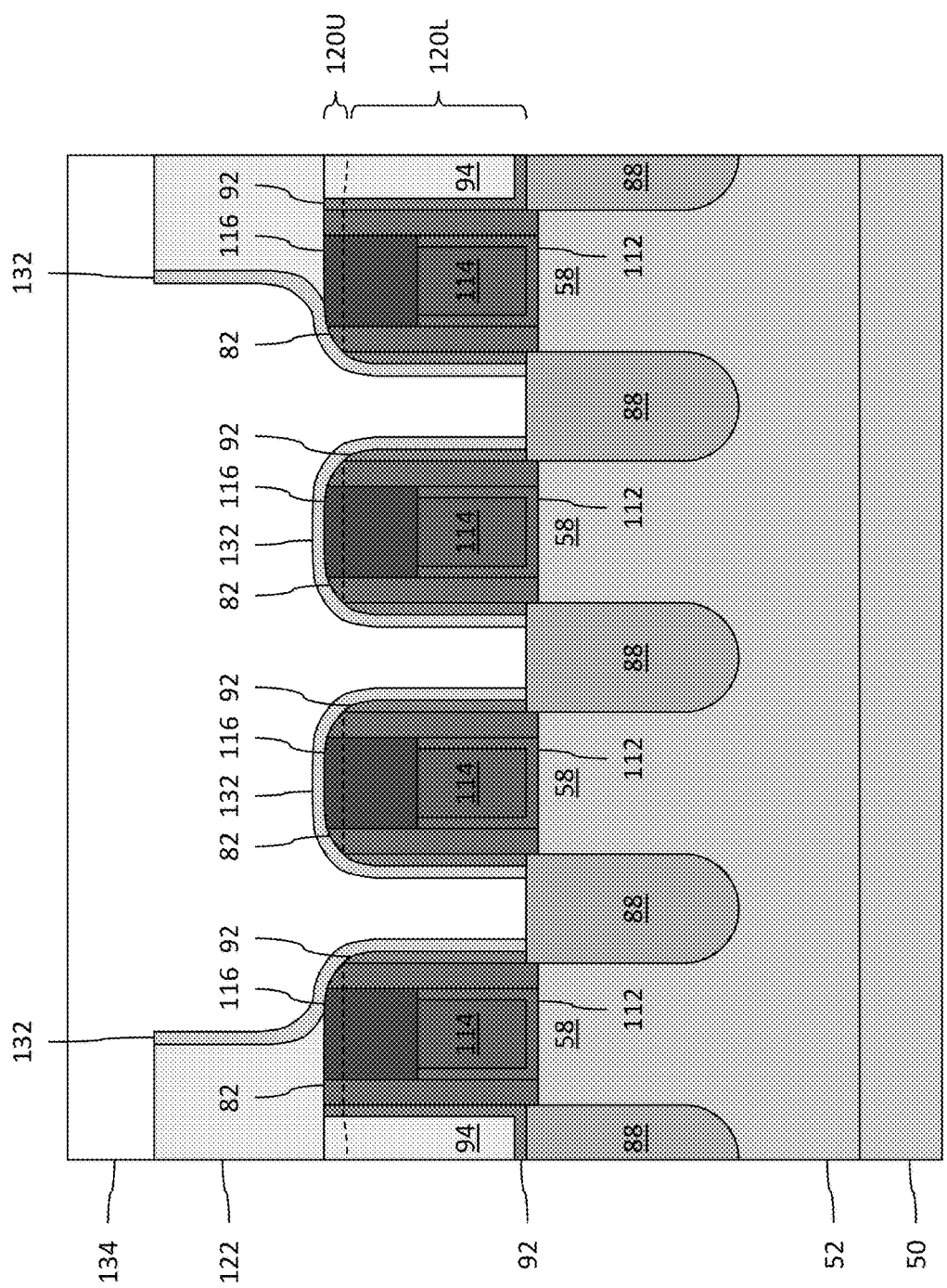
Figure 17C:
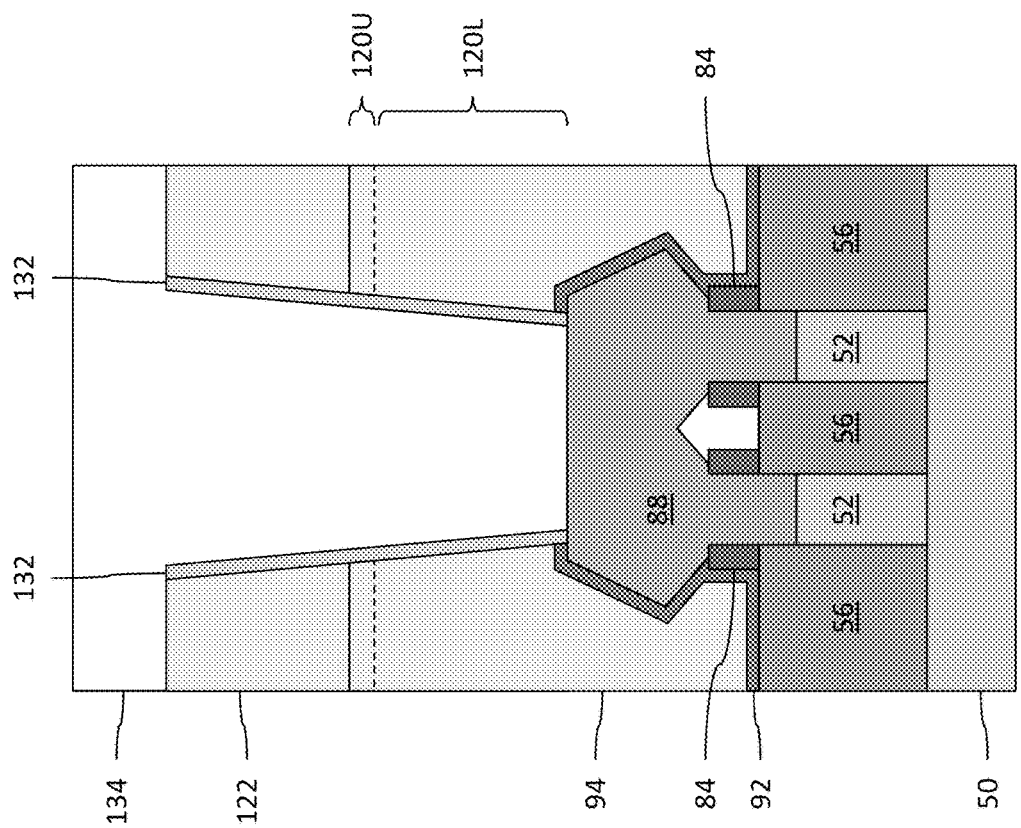
Figure 17B:
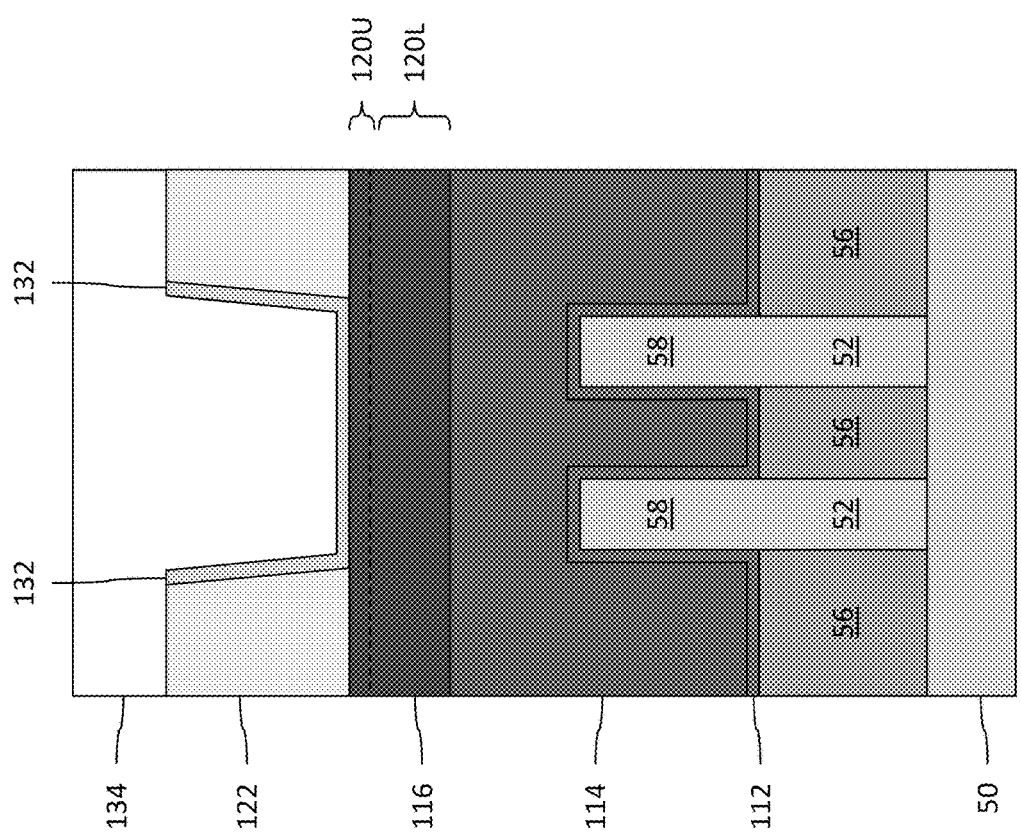

In FIGS. 17A-17C, contact spacers 132 are formed in the contact openings 128. The contact spacers 132 may be formed by conformally depositing one or more dielectric material(s) in the contact openings 128 and subsequently etching the dielectric material(s). Acceptable dielectric materials may include silicon nitride, silicon carbonitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the CESL 92 (thus forming the contact spacers 132). Some excess portions of the dielectric material(s) may remain over the top surfaces of the gate masks 116 after etching.

Conductive layer(s) 134 for source/drain contacts are formed in the contact openings 128. For example, the conductive layer(s) 134 may be formed by forming a liner (not separately illustrated), such as a diffusion barrier layer, an adhesion layer, or the like, and a conductive material in the contact openings 128. The liner may include titanium, titanium nitride, tantalum, tantalum nitride, or the like. The conductive material may be a metal such as cobalt, tungsten, copper, a copper alloy, silver, gold, aluminum, nickel, or the like, which may be formed by a deposition process such as PVD, ALD, CVD, or the like. The conductive layer(s) 134 are formed on the sidewalls and/or top surfaces of the contact spacers 132 and the dielectric layer 122.

Figure 18A:
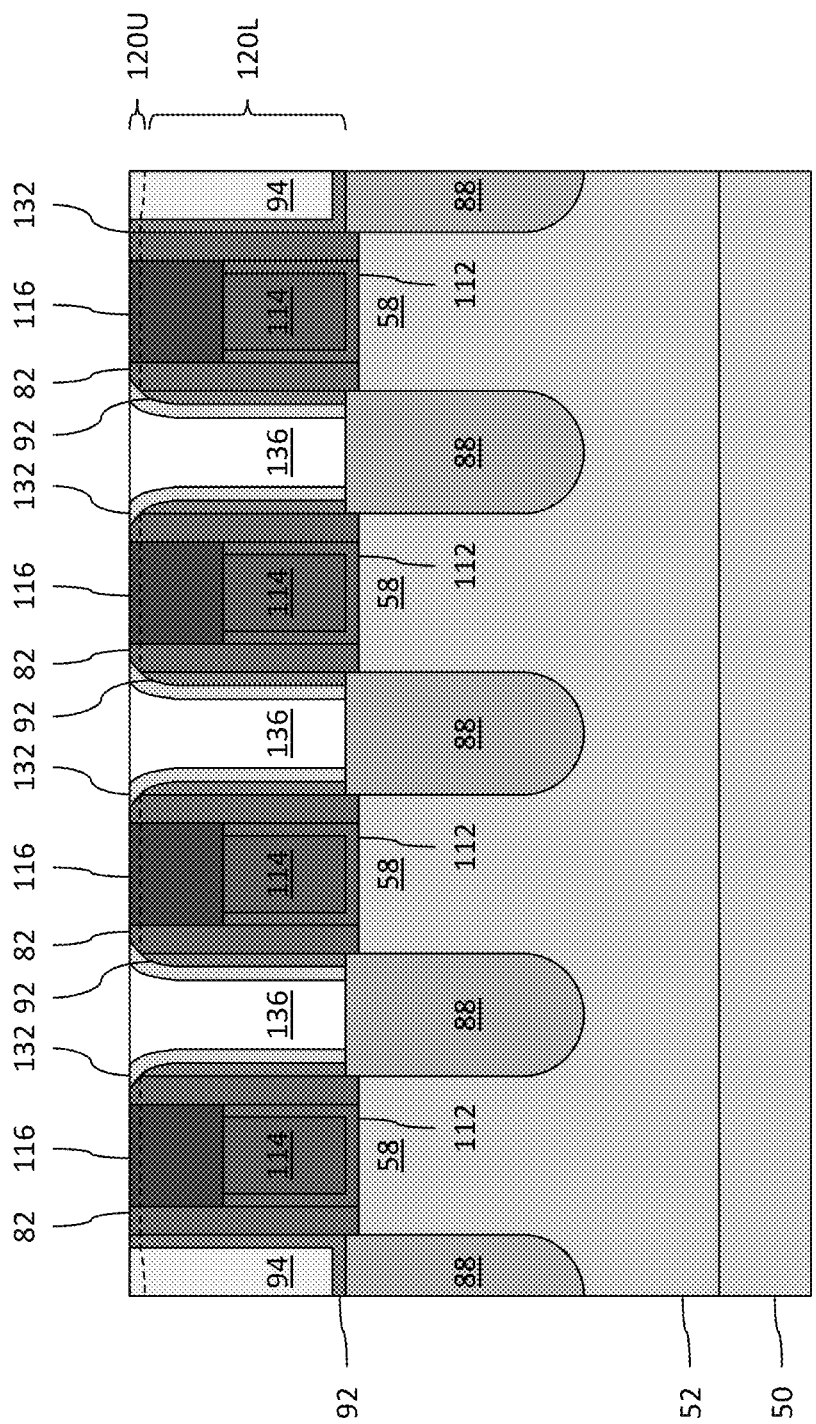
Figure 18C:
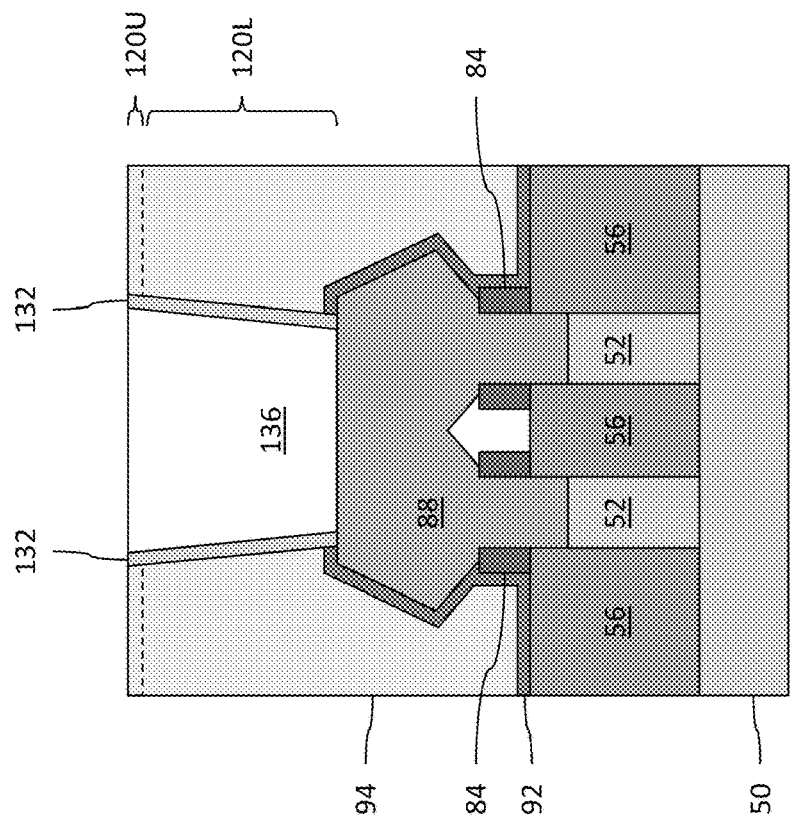
Figure 18B:
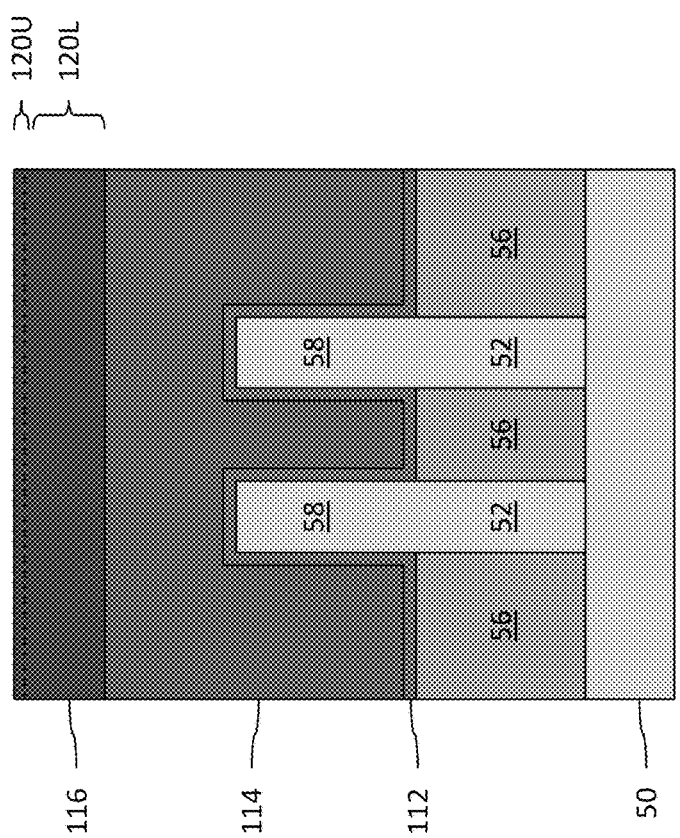

In FIGS. 18A-18C, a removal process is performed to remove excess portions of the conductive layer(s) 134 and the contact spacers 132, which excess portions are over the top surfaces of the gate masks 116. The removal process may also remove the dielectric layer 122. In some embodiments, a planarization process such as a chemical mechanical polish (CMP), an etch-back process, combinations thereof, or the like may be utilized. The remaining conductive layer(s) 134 in the contact openings 128 form source/drain contacts 136 in the contact openings 128. The source/drain contacts 136 extend through the first ILD 94 and the CESL 92 to contact the epitaxial source/drain regions 88. After the planarization process, the top surfaces of the source/drain contacts 136, the contact spacers 132, the gate masks 116, the first ILD 94, and the gate spacers 82 are coplanar (within process variations).

The removal process performed to remove the excess portions of the conductive layer(s) 134 and the contact spacers 132 may also remove some portions of the gate spacers 82, the first ILD 94, and the gate masks 116, depending on the selectivity of the removal processes. Specifically, some losses of the gate masks 116 may occur, such that the gate masks 116 and the gate spacers 82 have a reduced height. In the illustrated embodiment, the contact spacers 132 extend along and physically contact the rounded sidewalls of the remaining portions of the gate spacers 82, the CESL 92, and the gate masks 116. In another embodiment (subsequently described in greater detail for FIGS. 22-23), the height of the gate masks 116 and the gate spacers 82 is reduced until the top surfaces of the gate masks 116 and the CESL 92 are coplanar (within process variation), so that the contact spacers 132 are physically separated from the sidewalls of the gate masks 116 by the CESL 92.

In some embodiments, portions of the upper regions 120U of the gate spacers 82, the CESL 92, the first ILD 94, and the gate masks 116 remain after the removal process. For example, the removal process may thin but not remove the upper regions 120U of the various features. Although the gate spacers 82, the CESL 92, the first ILD 94, and the gate masks 116 contain the impurity implanted by the implantation process 118 (see FIGS. 14A-14C), the concentration of the impurity may be sufficiently low that device performance is not decreased. Further, and as previously noted, the presence of the impurity in the gate spacers 82, the CESL 92, the first ILD 94, and the gate masks 116 helps increase device performance by reducing losses when etching the contact openings 128 (see FIGS. 16A-16C), thereby reducing leakage between the source/drain contacts 136 and the gate electrodes 114. In another embodiment (subsequently described in greater detail for FIGS. 22-23), the height of the gate spacers 82, the CESL 92, the first ILD 94, and the gate masks 116 is reduced until the upper regions 120U of the gate spacers 82, the CESL 92, the first ILD 94, and the gate masks 116 are removed.

When portions of the upper regions 120U remain after the removal process, the source/drain contacts 136 extend through the upper regions 120U and the lower regions 120L of the various features. The source/drain contacts 136 have straight sidewalls in at least a portion of the lower regions 120L. The source/drain contacts 136 have rounded sidewall in the upper regions 120U (and may also have rounded sidewall in a portion of the lower regions 120L). The contact spacers 132 extend along the rounded sidewalls of the source/drain contacts 136 and along the rounded sidewalls of the remaining portions of the gate spacers 82, the CESL 92, and the gate masks 116.

Figure 19A:
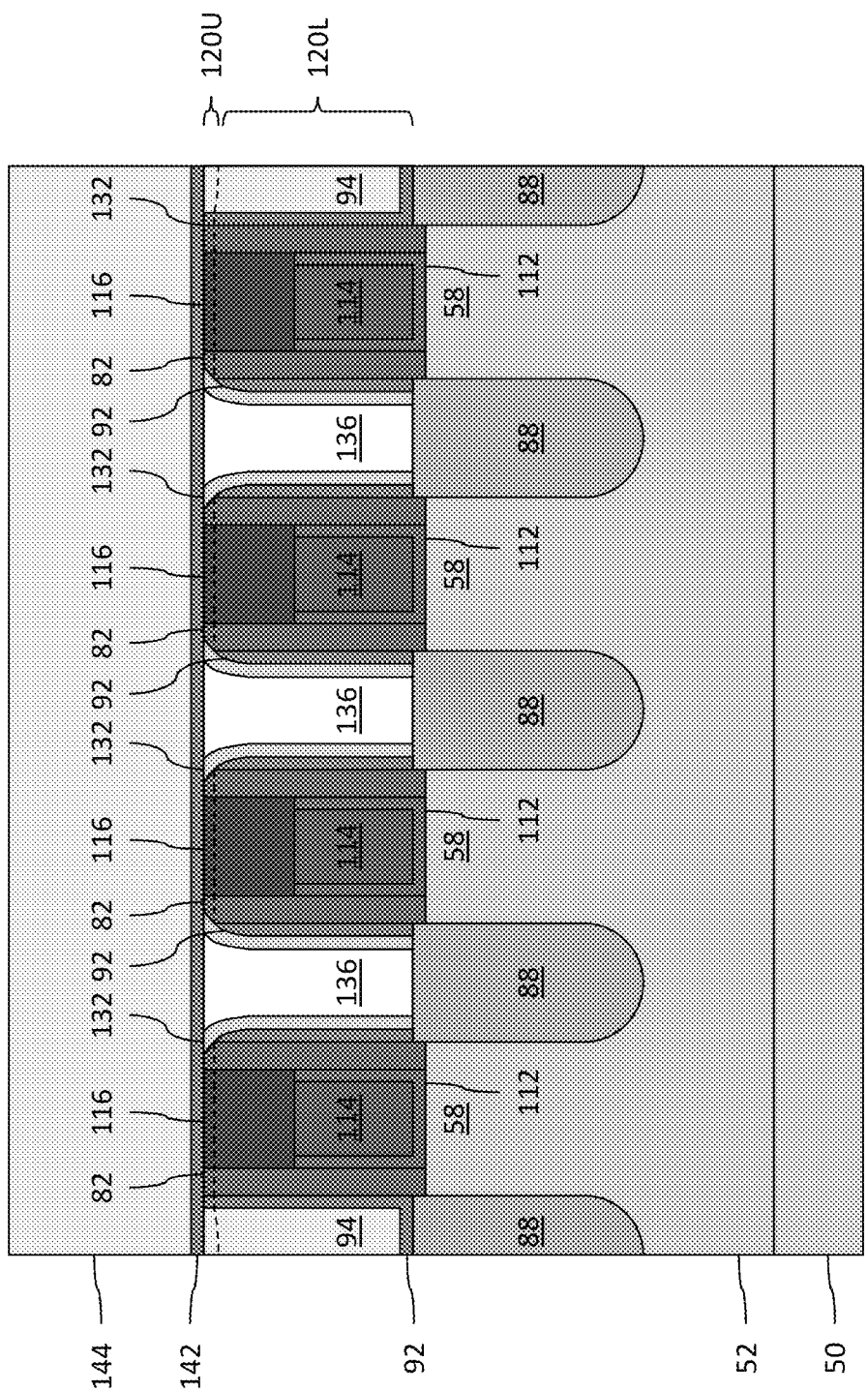
Figure 19C:
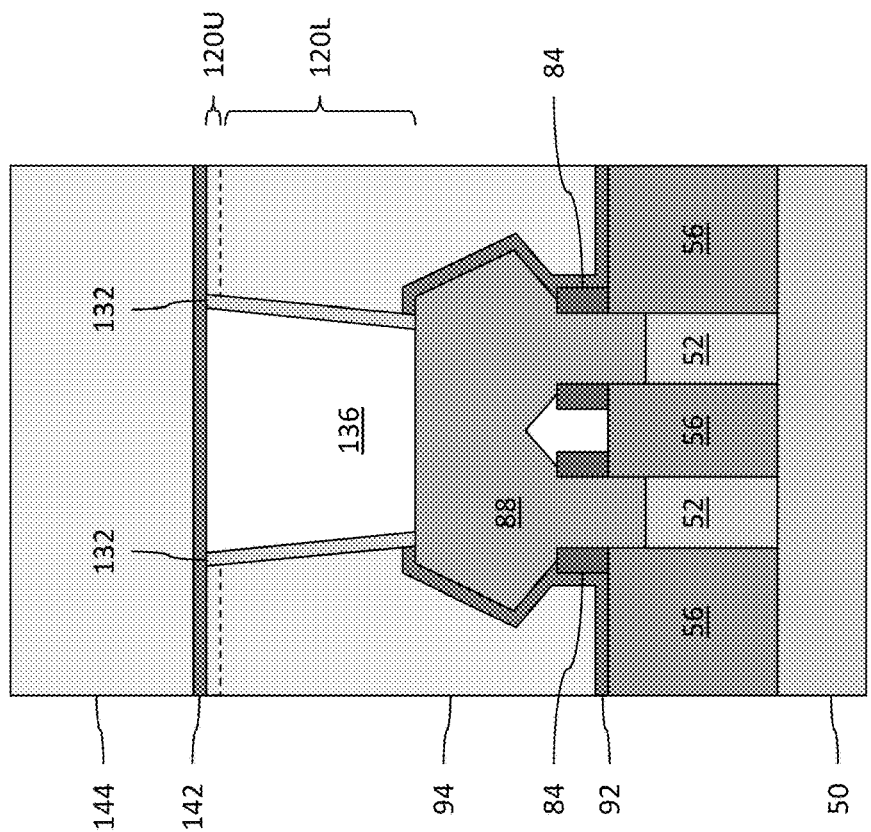
Figure 19B:
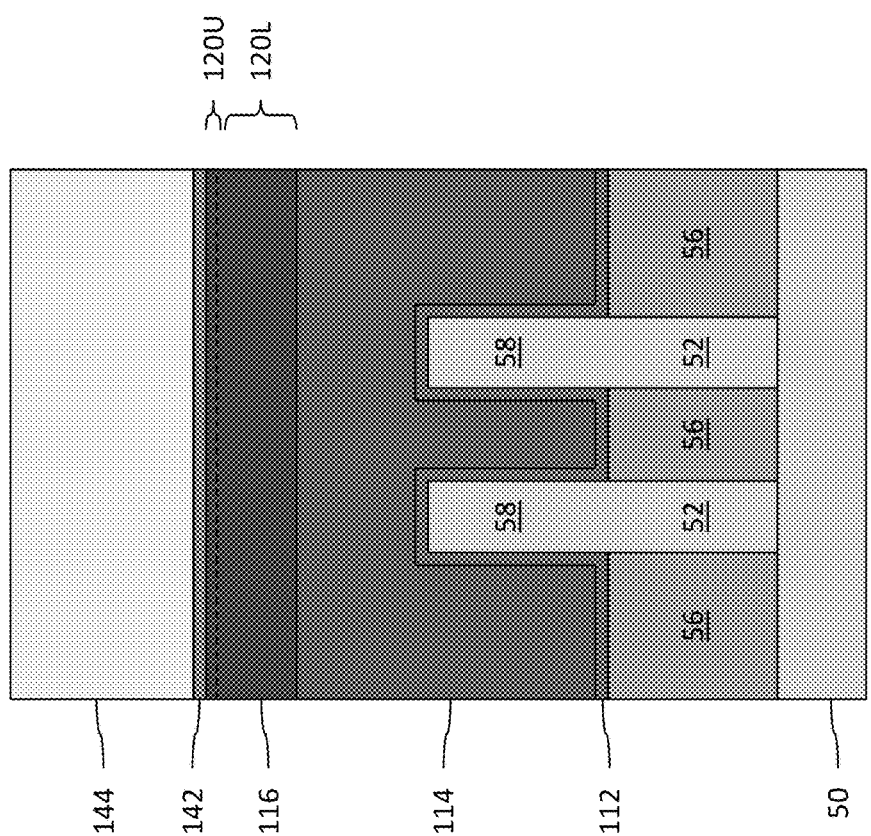

In FIGS. 19A-19C, a second ILD 144 is deposited over the first ILD 94, the gate masks 116, the source/drain contacts 136, and the contact spacers 132. In some embodiments, the second ILD 144 is a flowable film formed by a flowable CVD method. In some embodiments, the second ILD 144 is formed of a dielectric material such as PSG, BSG, BPSG, USG, or the like, which may be deposited by any suitable method, such as CVD, PECVD, or the like.

In some embodiments, an etch stop layer (ESL) 142 is formed between the second ILD 144 and the first ILD 94, the gate masks 116, the source/drain contacts 136, and the contact spacers 132. The ESL 142 may include a dielectric material, such as, silicon nitride, silicon oxide, silicon oxynitride, or the like, having a high etching selectivity from the etching of the second ILD 144.

Figure 20A:
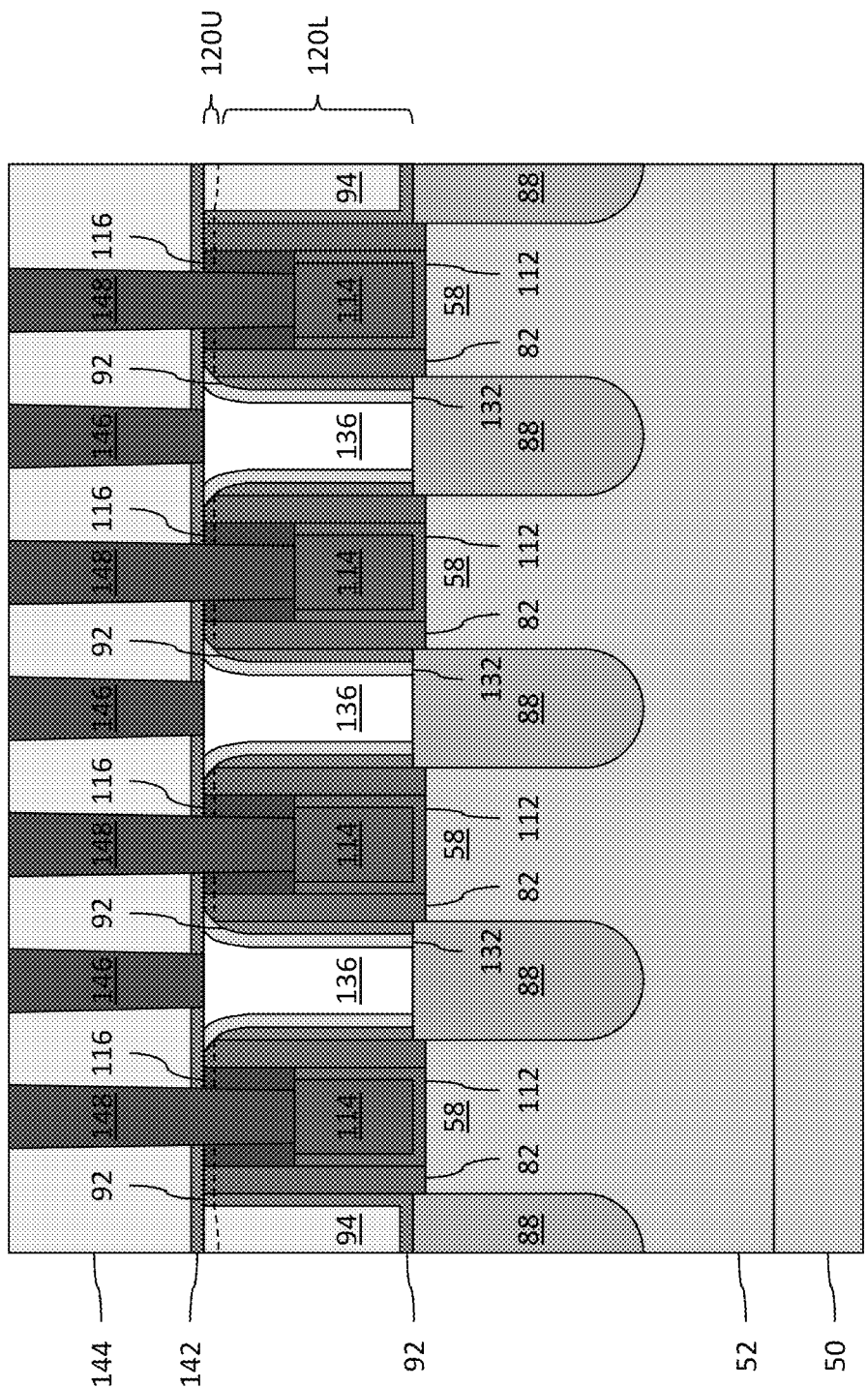
Figure 20C:
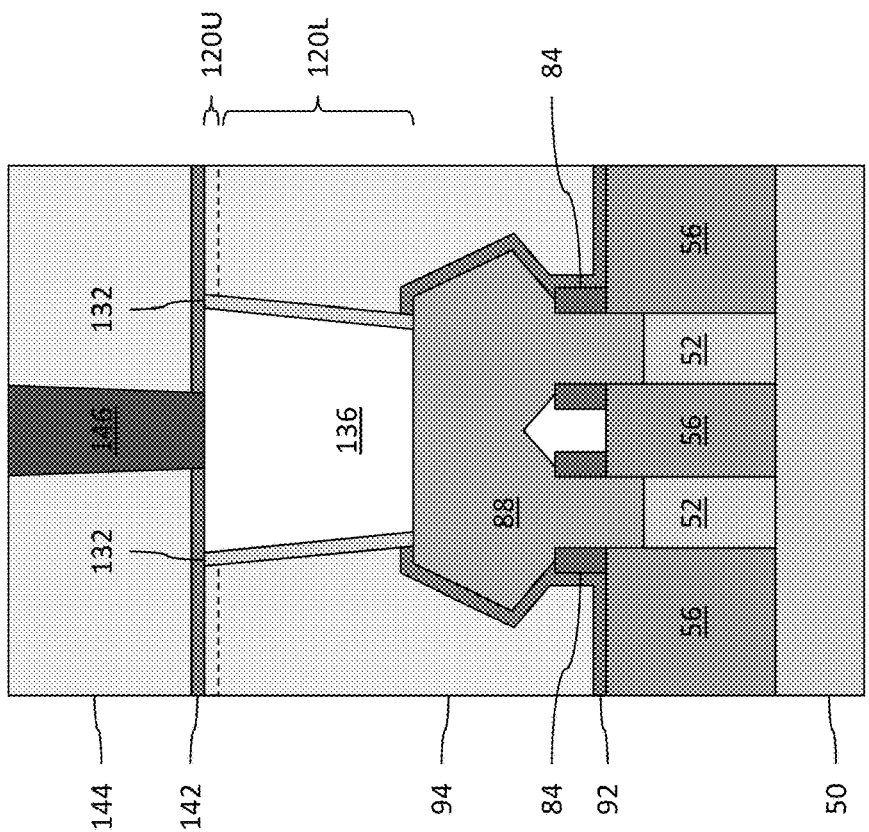
Figure 20B:
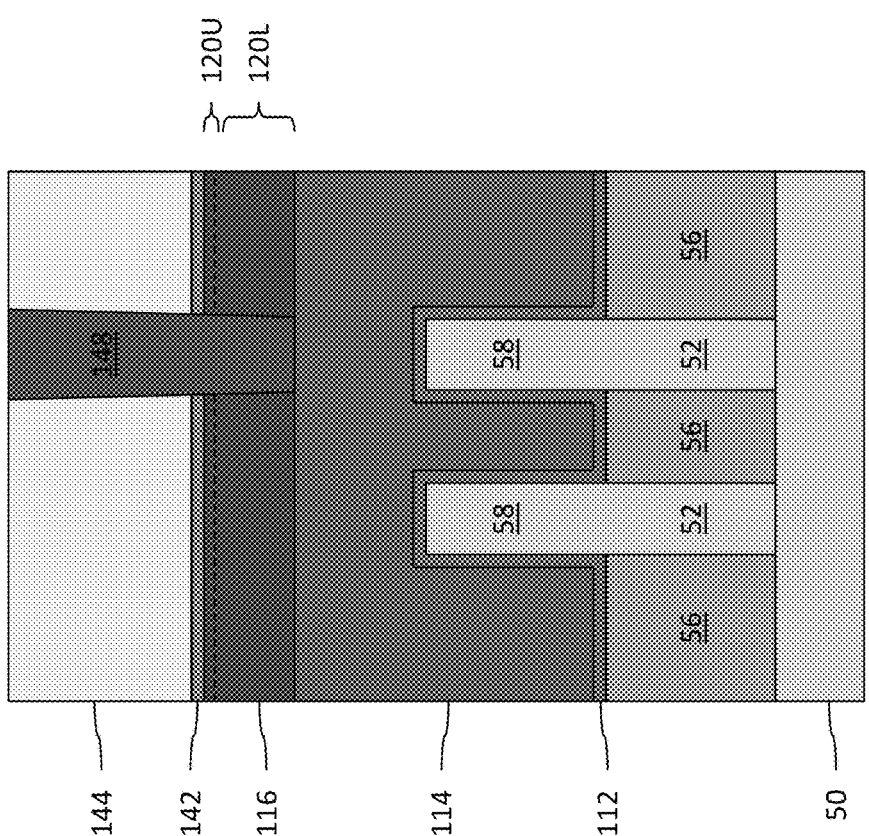

In FIGS. 20A-20C, source/drain contacts 146 and gate contacts 148 are formed to contact, respectively, the source/drain contacts 136 and the gate electrodes 114. The source/drain contacts 146 are physically and electrically coupled to the source/drain contacts 136. The gate contacts 148 are physically and electrically coupled to the gate electrodes 114.

As an example to form the source/drain contacts 146 and the gate contacts 148, openings for the source/drain contacts 146 are formed through the second ILD 144 and the ESL 142, and openings for the gate contacts 148 are formed through the second ILD 144, the ESL 142, and the gate masks 116. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be cobalt, tungsten, copper, a copper alloy, silver, gold, aluminum, nickel, or the like. A planarization process, such as a CMP, may be performed to remove excess material from the top surface of the second ILD 144. The remaining liner and conductive material form the source/drain contacts 146 and the gate contacts 148 in the openings. The source/drain contacts 146 and the gate contacts 148 may be formed in distinct processes, or may be formed in the same process. Although shown as being formed in the same cross-sections, it should be appreciated that each of the source/drain contacts 146 and the gate contacts 148 may be formed in different cross-sections, which may avoid shorting of the contacts.

Figure 21:
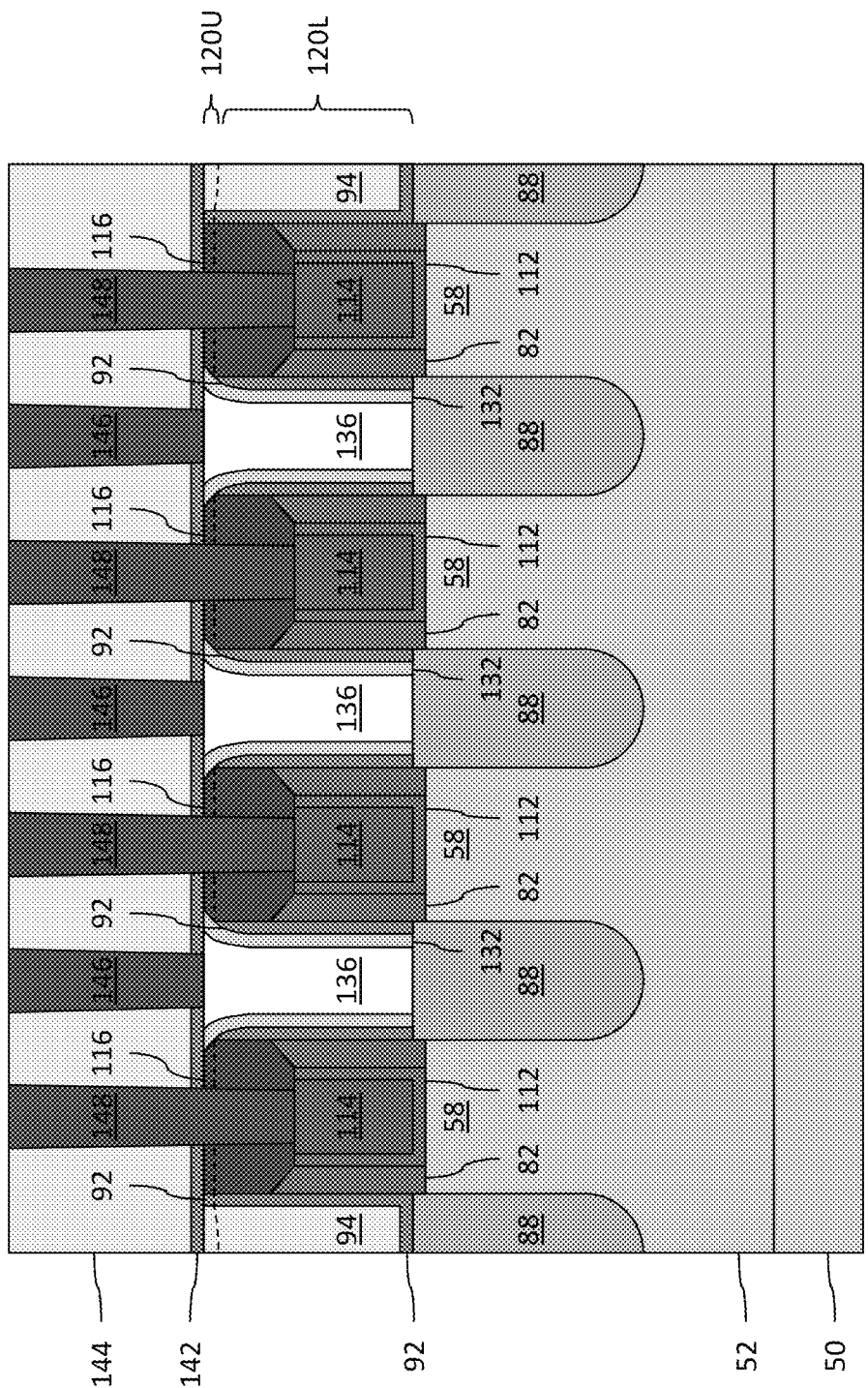
FIG. 21 is a view of FinFETs, in accordance with some other embodiments.

FIG. 21 is a view of FinFETs, in accordance with some other embodiments. The embodiment of FIG. 21 is similar to the embodiment of FIG. 20A, except the gate masks 116 are also formed over the gate spacers 82. This embodiment may be formed by recessing the gate spacers 82 before depositing the dielectric material(s) of the gate masks 116. As a result, the gate masks 116 cover the gate spacers 82. In some embodiments, no impurities are implanted in the gate spacers 82 as a result of being covered by the gate masks 116.

Figure 22:
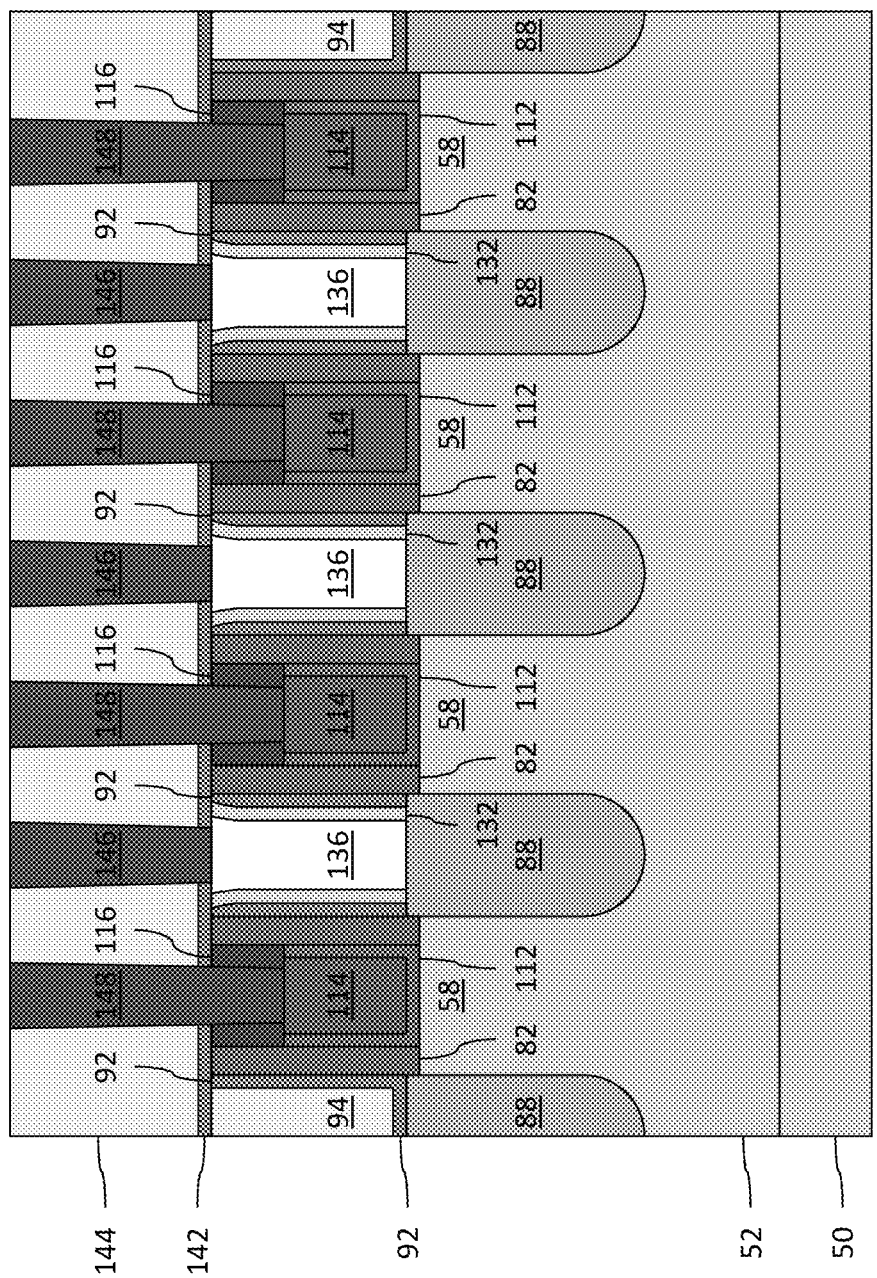
FIG. 22 is a view of FinFETs, in accordance with some other embodiments.
Figure 23:
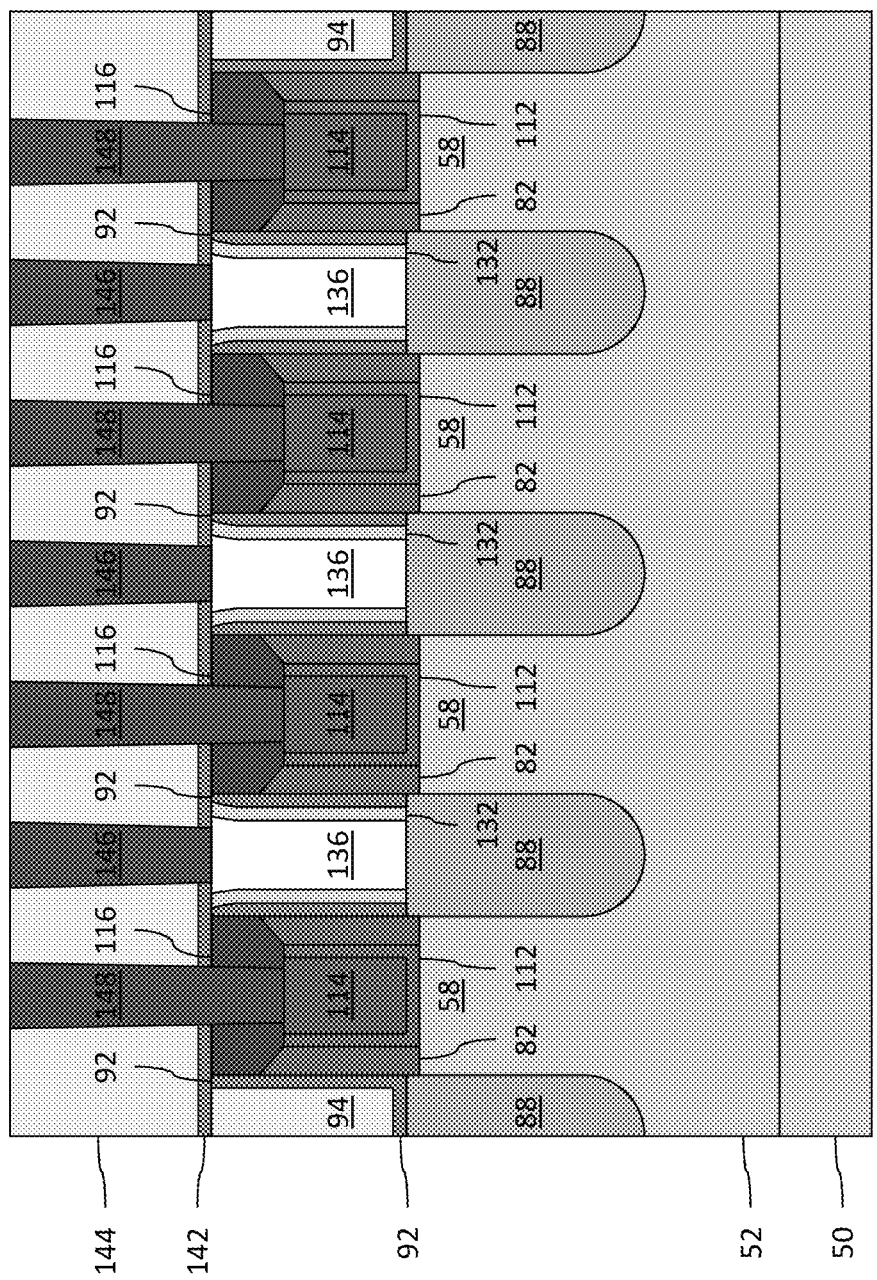
FIG. 23 is a view of FinFETs, in accordance with some other embodiments.

FIGS. 22-23 are views of FinFETs, in accordance with some other embodiments. The embodiments of FIGS. 22 and 23 are similar to the embodiments of FIGS. 20A and 21, respectively, except the contact spacers 132 are physically separated from the sidewalls of the gate masks 116 by the CESL 92. Further, the upper regions 120U of the gate spacers 82, the CESL 92, the first ILD 94, and the gate masks 116 are removed. These embodiments may be formed by performing the removal process described for FIGS. 18A-18C until the top surfaces of the gate masks 116 and the CESL 92 are coplanar (within process variation) and until the upper regions 120U are removed.

Embodiments may achieve advantages. Performing the implantation process 118 modifies the upper regions 120U of the gate spacers 82 (when applicable) and the gate masks 116 to be impurity-rich. The upper regions 120U of the gate spacers 82 and the gate masks 116 may thus have a high etching selectivity from the etching of the first ILD 94. Losses of the gate spacers 82 and the gate masks 116 may thus be reduced during a self-aligned contact (SAC) etching process for forming the contact openings 128. Decreasing such losses can reduce leakage between the source/drain contacts 136 and the gate electrodes 114, thereby increasing device performance.

The disclosed FinFET embodiments could also be applied to nanostructure devices such as nanostructure (e.g., nanosheet, nanowire, gate-all-around, or the like) field-effect transistors (NSFETs). In an NSFET embodiment, the fins are replaced by nanostructures formed by patterning a stack of alternating layers of channel layers and sacrificial layers.

Dummy gate structures and source/drain regions are formed in a manner similar to the above-described embodiments. After the dummy gate structures are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Further, the FinFET/NSFET devices may be interconnected by metallization layers in an overlying interconnect structure to form integrated circuits. The overlying interconnect structure can be formed in a back end of line (BEOL) process, in which the metallization layers are connected to the source/drain contacts 146 and the gate contacts 148. Additional features, such as passive devices, memories (e.g., magnetoresistive random-access memory (MRAM), resistive random access memory (RRAM), phase-change random access memory (PCRAM), etc.), or the like may be integrated with the interconnect structure during the BEOL process.

In an embodiment, a device includes: a gate structure on a channel region of a substrate; a gate mask on the gate structure, the gate mask including a first dielectric material and an impurity, a concentration of the impurity in the gate mask decreasing in a direction extending from an upper region of the gate mask to a lower region of the gate mask; a gate spacer on sidewalls of the gate mask and the gate structure, the gate spacer including the first dielectric material and the impurity, a concentration of the impurity in the gate spacer decreasing in a direction extending from an upper region of the gate spacer to a lower region of the gate spacer; and a source/drain region adjoining the gate spacer and the channel region. In some embodiments of the device, the first dielectric material is a nitride. In some embodiments of the device, the impurity is boron. In some embodiments of the device, the impurity is phosphorous. In some embodiments of the device, the lower region of the gate mask is free of the impurity. In some embodiments of the device, the lower region of the gate mask includes the impurity.

In an embodiment, a device includes: a source/drain region adjoining a channel region of a substrate; an etch stop layer on the source/drain region; an inter-layer dielectric on the etch stop layer, the inter-layer dielectric including a first dielectric material and an impurity, an upper region of the inter-layer dielectric having a greater concentration of the impurity than a lower region of the inter-layer dielectric; and a source/drain contact extending through the inter-layer dielectric and the etch stop layer to contact the source/drain region, the source/drain contact having a straight sidewall in the lower region of the inter-layer dielectric, the source/drain contact having a rounded sidewall in the upper region of the inter-layer dielectric. In some embodiments, the device further includes: a gate structure on the channel region; and a gate mask on the gate structure, the gate mask including a second dielectric material and the impurity, the second dielectric material being different from the first dielectric material, a top surface of the gate mask being coplanar with a top surface of the inter-layer dielectric. In some embodiments, the device further includes: a gate spacer between the source/drain region and the gate structure, the gate spacer including the second dielectric material and the impurity, a top surface of the gate spacer being coplanar with the top surface of the inter-layer dielectric. In some embodiments of the device, the gate spacer has a rounded sidewall, and the device further includes: a contact spacer around the source/drain contact, the contact spacer extending along the rounded sidewall of the gate spacer and the rounded sidewall of the source/drain contact.

In an embodiment, a method includes: depositing an inter-layer dielectric on a source/drain region; forming a gate mask on a gate structure, the gate structure disposed on a channel region of a substrate, the channel region adjoining the source/drain region; implanting an impurity in the gate mask to increase an etching selectivity between the gate mask and the inter-layer dielectric relative a contact etching process; and performing the contact etching process to pattern a contact opening in the inter-layer dielectric, the contact opening exposing the source/drain region, the gate mask covering the gate structure during the contact etching process. In some embodiments of the method, the gate mask includes a nitride, the inter-layer dielectric includes an oxide, and the impurity is boron or phosphorous. In some embodiments of the method, implanting the impurity in the gate mask includes: placing the substrate on an implanter platen; implanting the impurity in the gate mask while controlling temperature of the implanter platen; and annealing the gate mask. In some embodiments of the method, impurity is implanted with an implantation energy in a range of 0.5 keV to 10 keV while the implanter platen is heated to a temperature in a range of 100° C. to 500° C. In some embodiments of the method, the gate mask is annealed with a melting laser annealing (MLA) performed at a temperature in a range of 800° C. to 1000° C., and for a duration in a range of 1 µs to 10 µs. In some embodiments of the method, performing the contact etching process includes: etching the inter-layer dielectric with $C_4F_6$ while generating a plasma, a protective layer formed on the gate mask during the contact etching process, the protective layer including a polymer byproduct of the contact etching process. In some embodiments of the method, the protective layer has a thickness in a range of 0 Å to 200 Å. In some embodiments, the method further includes: forming a gate spacer between the gate structure and the source/drain region; and implanting the impurity in the gate spacer while implanting the impurity in the gate mask. In some embodiments, the method further includes: implanting the impurity in the inter-layer dielectric while implanting the impurity in the gate mask, the impurity implanted to a greater depth in the inter-layer dielectric than in the gate mask. In some embodiments of the method, after implanting the impurity in the gate mask, a concentration of the impurity in the gate mask decreases in a direction extending from an upper region of the gate mask to a lower region of the gate mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing an inter-layer dielectric on a source/drain region;
   forming a gate mask on a gate structure, the gate structure disposed on a channel region of a substrate, the channel region adjoining the source/drain region;
   implanting an impurity in the gate mask to increase an etching selectivity between the gate mask and the inter-layer dielectric relative a contact etching process; and
   performing the contact etching process to pattern a contact opening in the inter-layer dielectric, the contact opening exposing the source/drain region, the gate mask covering the gate structure during the contact etching process, a protective layer being formed on the gate mask during the contact etching process, the protective layer comprising a polymer byproduct of the contact etching process.

2. The method of claim 1, wherein the gate mask comprises a nitride, the inter-layer dielectric comprises an oxide, and the impurity is boron or phosphorous.

3. The method of claim 1, wherein implanting the impurity in the gate mask comprises:
   placing the substrate on an implanter platen;
   implanting the impurity in the gate mask while controlling temperature of the implanter platen; and
   annealing the gate mask.

4. The method of claim 3, wherein the impurity is implanted with an implantation energy in a range of 0.5 keV to 10 keV while the implanter platen is heated to a temperature in a range of 100° C. to 500° C.

5. The method of claim 3, wherein the gate mask is annealed with a melting laser annealing (MLA) performed at a temperature in a range of 800° C. to 1000° C., and for a duration in a range of 1 µs to 10 µs.

6. The method of claim 1, wherein performing the contact etching process comprises:
   etching the inter-layer dielectric with $C_4F_6$ while generating a plasma.

7. The method of claim 1, wherein the protective layer has a thickness in a range of 0 Å to 200 Å.

8. The method of claim 1 further comprising:
   forming a gate spacer between the gate structure and the source/drain region; and
   implanting the impurity in the gate spacer while implanting the impurity in the gate mask.

9. The method of claim 1 further comprising:
   implanting the impurity in the inter-layer dielectric while implanting the impurity in the gate mask, the impurity implanted to a greater depth in the inter-layer dielectric than in the gate mask.

10. The method of claim 1, wherein after implanting the impurity in the gate mask, a concentration of the impurity in the gate mask decreases in a direction extending from an upper region of the gate mask to a lower region of the gate mask.

11. A method comprising:
    depositing an etch stop layer on a source/drain region;
    depositing an inter-layer dielectric on the etch stop layer;
    implanting an impurity in an upper region of the inter-layer dielectric, the upper region of the inter-layer dielectric having a greater concentration of the impurity than a lower region of the inter-layer dielectric;
    etching a contact opening in the inter-layer dielectric and the etch stop layer, the contact opening exposing the source/drain region, the contact opening having a straight sidewall in the lower region of the inter-layer dielectric, the contact opening having a rounded sidewall in the upper region of the inter-layer dielectric; and
    forming a source/drain contact in the contact opening, a top surface of the source/drain contact being coplanar with a top surface of the inter-layer dielectric.

12. The method of claim 11 further comprising:
    forming the source/drain region adjacent a gate spacer, the impurity implanted in an upper region of the gate spacer, the upper region of the gate spacer having a greater concentration of the impurity than a lower region of the gate spacer.

13. The method of claim 12 further comprising:
    forming a gate structure adjacent the gate spacer; and
    forming a gate mask on the gate structure, the impurity implanted in an upper region of the gate mask, the upper region of the gate mask having a greater concentration of the impurity than a lower region of the gate mask.

14. The method of claim 11 further comprising:
    forming a contact spacer in the contact opening, the contact spacer extending along the rounded sidewall and the straight sidewall of the contact opening.

15. The method of claim 11, wherein the impurity is boron or phosphorous.

16. The method of claim 11, wherein the lower region of the inter-layer dielectric is free of the impurity.

17. The method of claim 11, wherein the lower region of the inter-layer dielectric comprises the impurity.

18. A method comprising:
    forming a gate structure adjacent a gate spacer;
    forming a gate mask on the gate structure;
    implanting an impurity in the gate mask and the gate spacer, a concentration of the impurity in the gate mask decreasing in a direction extending from an upper region of the gate mask to a lower region of the gate mask, a concentration of the impurity in the gate spacer decreasing in a direction extending from an upper region of the gate spacer to a lower region of the gate spacer; and
    forming a contact extending through the gate mask to contact the gate structure.

19. The method of claim 18 further comprising:
    forming a source/drain region adjacent the gate spacer; and
    depositing an inter-layer dielectric on the source/drain region, the impurity implanted in the inter-layer dielectric, a concentration of the impurity in the inter-layer dielectric decreasing in a direction extending from an upper region of the inter-layer dielectric to a lower region of the inter-layer dielectric.

20. The method of claim 19 further comprising:
    performing a contact etching process to pattern a contact opening in the inter-layer dielectric, wherein implanting the impurity in the gate mask increases an etching selectivity between the gate mask and the inter-layer dielectric relative the contact etching process.

* * * * *